US009973850B2

(12) United States Patent
Yasuda et al.

(10) Patent No.: US 9,973,850 B2
(45) Date of Patent: May 15, 2018

(54) SPEAKER CONTROL DEVICE AND SPEAKER CONTROL METHOD

(71) Applicant: Trigence Semiconductor, Inc., Tokyo (JP)

(72) Inventors: Akira Yasuda, Tokyo (JP); Jun-ichi Okamura, Tokyo (JP)

(73) Assignee: TRIGENCE SEMICONDUCTOR, INC., Tokyo (JP)

( * ) Notice: Subject to any disclaimer, the term of this patent is extended or adjusted under 35 U.S.C. 154(b) by 110 days.

(21) Appl. No.: 15/003,146

(22) Filed: Jan. 21, 2016

(65) Prior Publication Data

US 2016/0142819 A1 May 19, 2016

Related U.S. Application Data

(63) Continuation of application No. PCT/JP2014/069748, filed on Jul. 25, 2014.

(30) Foreign Application Priority Data

Jul. 25, 2013 (JP) ................................ 2013-154633

(51) Int. Cl.

*H03G 11/00* (2006.01)
*H04R 3/00* (2006.01)
*H04R 29/00* (2006.01)
*H03F 99/00* (2009.01)
*H04R 1/00* (2006.01)

(52) U.S. Cl.

CPC ........... *H04R 3/007* (2013.01); *H04R 29/003* (2013.01); *H04R 1/005* (2013.01); *H04R 3/002* (2013.01)

(58) Field of Classification Search

CPC ...... H04R 3/007; H04R 29/003; H04R 1/005; H04R 3/002
USPC ............... 381/55-59, 120; 333/124, 17.3, 32
See application file for complete search history.

(56) References Cited

U.S. PATENT DOCUMENTS 5,548,650 A * 8/1996 Clark .................... H03G 11/00 381/100
6,809,604 B2 10/2004 Kawakubo et al.
7,268,636 B2 9/2007 Takeuchi et al.
7,436,967 B2 10/2008 Neunaber
(Continued)

FOREIGN PATENT DOCUMENTS

CN 1449110 A 10/2003
CN 1722608 A 1/2006
(Continued)

OTHER PUBLICATIONS

Ring Oscillators: Characteristics and application, M. K. Mandal & B C Sarkar, Nov. 3, 2009).*
Ternary Digital System : Concepts and Applications (www.esciencemedicine.com/ebooks).*
Poki Chen et al. "A Time-to-Digital-Converter-Based CMOS Smart Temperature Sensor", IEEE Journal of Solid-State Circuits, vol. 40, No. 8, Aug. 2005, pp. 1642-1648.
(Continued)

*Primary Examiner* — Vivian Chin
*Assistant Examiner* — Ammar Hamid
(74) *Attorney, Agent, or Firm* — Hauptman Ham, LLP

(57) ABSTRACT

A speaker control device in one embodiment includes an oscillator connected in parallel with a drive circuit for driving a speaker, the oscillator changing an oscillation frequency according to a voltage, and a control circuit detecting a variation in the oscillation frequency of the oscillator, and adjusting an amount of current supplied to the speaker by the drive circuit in the case where a variation in the voltage exceeds an allowable value.

35 Claims, 18 Drawing Sheets

(56) References Cited

U.S. PATENT DOCUMENTS

| | | | | |
|---|---|---|---|---|
| 2004/0086140 | A1 | 5/2004 | Fedigan et al. | |
| 2005/0031139 | A1* | 2/2005 | Browning .............. | H04R 3/002 381/96 |
| 2009/0110217 | A1 | 4/2009 | Yasuda et al. | |
| 2012/0020488 | A1 | 1/2012 | Huijser et al. | |
| 2012/0328113 | A1 | 12/2012 | Gautama | |
| 2013/0077796 | A1 | 3/2013 | Risbo et al. | |

FOREIGN PATENT DOCUMENTS

| | | | |
|---|---|---|---|
| JP | H7-099698 | A | 4/1995 |
| JP | 2006-191250 | A | 7/2006 |
| JP | 2007-110369 | A | 4/2007 |
| JP | 2010-167912 | A | 8/2010 |
| WO | 2007-135928 | A9 | 11/2007 |

OTHER PUBLICATIONS

International Search Report of PCT/JP2014/069748.

Written Opinion of the International Search Authority regarding PCT/JP2014/069748.

International Preliminary Report of PCT/JP2014/069748.

English Partial Translation of Written opinion of International Searching Authority with regard to PCT/JP2014/069748.

English Translation of International Preliminary Report of PCT/JP2014/069748.

Chinese Office Action dated Mar. 15, 2018 for the corresponding Chinese application No. 201480040752.X, citing above references. With partial English translation.

* cited by examiner

| A | /A | state |
|---|---|---|
| 0 | 0 | 0 |
| 0 | 1 | -1 |
| 1 | 0 | +1 |
| 1 | 1 | 0 |

(B)

(A)

SPEAKER CONTROL DEVICE AND SPEAKER CONTROL METHOD

CROSS-REFERENCE TO RELATED APPLICATIONS

This application is a U.S. continuation application filed under 35 U.S.C. § 111(a), of International Application No. PCT/JP2014/069748, filed on Jul. 25, 2014, which claims priority to Japanese Patent Application No. 2013-154633, filed on Jul. 25, 2013, the disclosures of which are incorporated by reference.

FIELD

The present invention is related to a speaker control device, in particular to a speaker control device including a speaker protection function.

BACKGROUND

A control device for preventing mechanical damage to a dynamic speaker is proposed in U.S. Patent Application Publication No. 2012/0328113.

Mechanical defects of a small scale speaker such as that used in mobile devices occur when the temperature of a coil rises due to an excessive current flowing in the speaker coil and as a result exceeds the heat resistance temperature of the insulation material of the coil wire. Air which is filled in a narrow gap between a magnet wrapped around the coil and the coil itself is used as a medium for dissipating the heat of the coil which is generated towards the magnet. In addition, heat in the air of the narrow gap between the magnet which wraps the coil ad the coil itself is also dissipated by the flow of air generated by vibration of the speaker diaphragm.

The flow of air from the speaker diaphragm stops in a state where vibration of the speaker diaphragm for some reasons is suppressed. As a result, since the heat dissipated effects of the heat generated in a coil decrease, mechanical damage to the speaker can easily occur. In particular, it is necessary to pass a large current when attempting to obtain a large volume by vigorously amplifying a diaphragm. At this time, since the temperature of a speaker coil increases rapidly in a state where vibration (amplitude) of the diaphragm is repressed by an external force, mechanical damage can easily occur.

The speaker aperture in a small scale speaker such as that used in mobile devices is small. Therefore, the aperture part is often blocked by a finger of palm of a hand. Since vibration compliance changes depending on the state of the aperture part, the vibration of the diaphragm is sometimes suppressed. Therefore, it is necessary to prevent mechanical damage to a speaker by feedback control of a current flowing in a coil by dynamically detecting this type of state.

In FIG. 3 of U.S. Patent Application Publication No. 2012/0328113, a method is disclosed in which a serial resistor (34) is inserted between an amp (32) which drives a speaker and the speaker (36), the voltage and current of the serial resistor end is measured, the admittance (impedance) of the speaker is dynamically measured and the amplitude of an input signal is controlled based on the measurement results In this way, a means of feedback control of speaker vibration by inserting a serial resistor between an amp which drives a speaker and the speaker and measuring the current flowing through a speaker is also proposed in U.S. Patent Application Publication No. 2013/0077796, U.S. Patent Application Publication No. 2004/0086140 and U.S. Pat. No. 7,436,967. In addition, technologies such as those disclosed in U.S. Patent Application Publication No. 2012/0020488 and IEEE JOURNAL OF SOLID-STATE CIRCUITS, VOL. 40, NO. 8, August 2005 have also been proposed.

SUMMARY

One embodiment provides a speaker control device including an oscillator connected in parallel with a drive circuit for driving a speaker, the oscillator changing an oscillation frequency according to a voltage, and a control circuit detecting a variation in the oscillation frequency of the oscillator, and adjusting an amount of current supplied to the speaker by the drive circuit in the case where a variation in the voltage exceeds an allowable value.

One embodiment provides a speaker control method including detecting a variation in an oscillation frequency of an oscillator connected in parallel with a drive circuit for driving a speaker, the oscillator changing an oscillation frequency according to a voltage, judging a variation in voltage from a variation in the oscillation frequency of the oscillator, and adjusting an amount of current supplied to the speaker when a variation in the voltage exceeds an allowable value.

One embodiment provides a speaker control device including an oscillator connected in parallel and outputting an alternating signal to an one element or two or more elements connected in series among a plurality of elements forming a drive circuit for driving a coil of a speaker according to a digital signal, an impedance calculation circuit extracting a signal of a frequency component of the alternating signal output by the oscillator and calculating a value corresponding to the magnitude of an impedance of the coil, and a control circuit controlling the magnitude of a signal supplied to the coil of the speaker according to the value calculated by the impedance calculation circuit.

DESCRIPTION OF EMBODIMENTS

Inserting a serial resistor between an amp which drives a speaker and the speaker comes with a loss in output power of the speaker. In addition, it is necessary to install a highly accurate analog-digital conversion circuit in a control device in order to measure a current flowing through the serial resistor. On the other hand, since a comparatively large silicon area is required for mounting a highly accurate analog-digital device in a CMOS circuit, there is problem in which the unit cost of an LSI which is a control circuit does not decrease.

In addition, a digital acoustic system exists such as that proposed in PCT Publication No. 2007/135928 in which a digital signal is directly converted to analog audio using a circuit input with a digital audio signal and which outputs a plurality of digital signal and a plurality of coils driven by the plurality of digital signals. In this case, a problem arises in whereby it is necessary to install a plurality of highly accurate analog-digital conversion devices in a control device.

Since equivalent impedance of speakers connected in parallel decreases in the case of a digital acoustic system which directly converts a digital signal to analog audio using a plurality of coils (unit), it is possible to gain sound pressure using a low voltage. On the other hand, since it is difficult to mount a highly accurate analog-digital conversion device which operates at a low voltage using a CMOS circuit, there is a problem whereby it is difficult to realize a protection circuit suitable for a low voltage driven speaker drive device using a plurality of coils.

Therefore, one aim of the present invention is to provide a control device which can prevent mechanical damage to a speaker by detecting a change in mechanical vibration compliance of a speaker without direct measurement of a current flowing in a speaker coil from both ends of a serial resistor or an analog voltage signal from a current probe using an analog-digital conversion device, and by performing feedback control of a current flowing in a speaker coil according to the change.

According to one embodiment, it is possible to measure a current flowing in a speaker coil using an oscillation frequency of an oscillator. In addition, using this structure, it is possible to perform feedback control of a current flowing in a coil or temperature of a coil by detecting a change in mechanical vibration compliance or a change in impedance of a speaker using only a digital circuit.

Forms for realizing the present invention are explained below using a number of embodiments. Furthermore, the present invention is not limited to the embodiments explained below. The present invention can also be realized by making various modifications of the embodiments explained below.

Figure 1A:
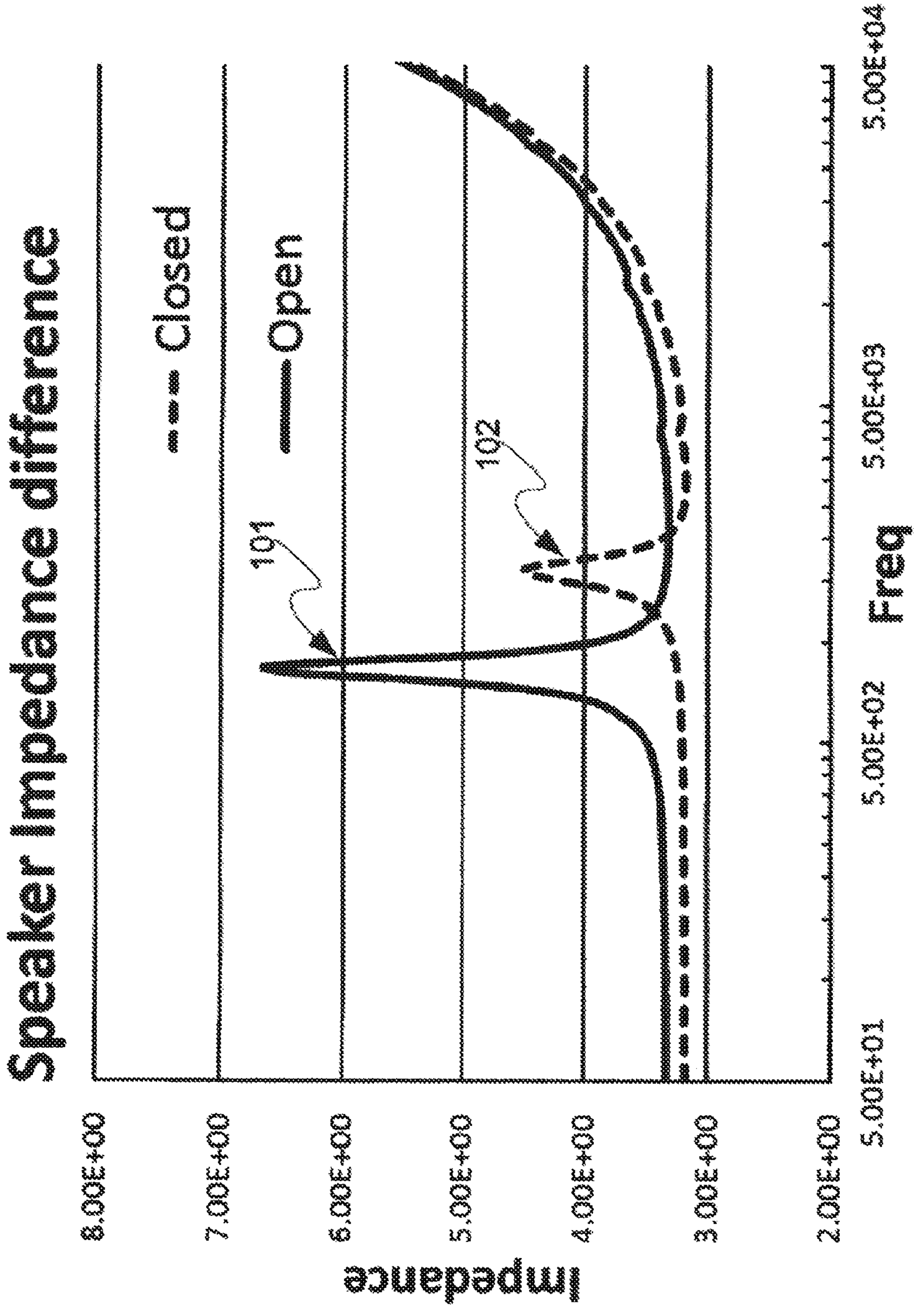
FIG. 1A is a diagram showing a relationship between electrical impedance and vibration compliance.

Electrical impedance (101) in the case where a front surface aperture of a mobile small scale speaker is open and electrical impedance (102) in the case where the front surface aperture is closed is shown in FIG. 1A. As can be seen from FIG. 1A, a change in mechanical vibration compliance of a speaker becomes a change in electrical impedance and in particular a change in a resonance frequency f0 of a speaker is shown.

Figure 1B:
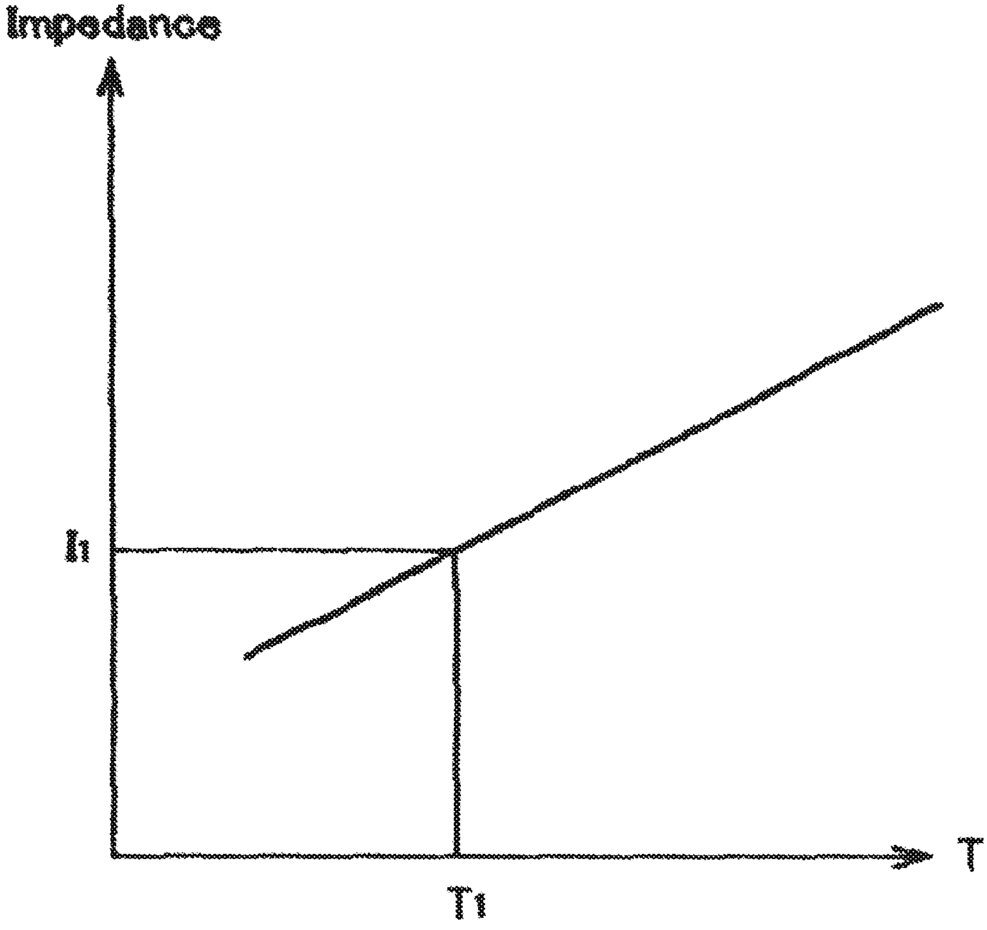
FIG. 1B is a diagram showing a relationship between the temperature of a speaker coil and electrical impedance.

It is possible to measure a change in electrical impedance as a change in the amount of current with respect to a voltage. That is, since the apparent impedance decreases when a resonance frequency shifts in the case where a front surface aperture is closed, the current which flows in a speaker in the vicinity of f0 increases in the case where the front surface aperture is open. A frequency corresponding to a peak value of a graph indicated by the symbol 101 is given as $f_{101}$. Impedance at $f_{101}$ in a graph indicated by the symbol 102 is different to impedance at $f_{101}$ in a graph indicated by the symbol 101. In FIG. 1A, impedance at $f_{101}$ in a graph indicated by the symbol 102 is smaller than Impedance at $f_{101}$ in a graph indicated by the symbol 101. As a result, a current flowing in a speaker in the vicinity of $f_{101}$ is different between the case of a graph indicated by the symbol 102 and the case of a graph indicated by the symbol 101. In FIG. 1A, the current flowing in a speaker in the vicinity of $f_{101}$ is larger in the case of a graph indicated by the symbol 102 than the case of a graph indicated by the symbol 101. Therefore, it is possible to detect a change in mechanical vibration compliance of a speaker by detecting a change in impedance FIG. 1B is a graph showing the relationship between the temperature of a speaker coil in the case where vibration frequency of a speaker (frequency of audio played back by a speaker) is determined to a specific value, and the magnitude of impedance of a speaker coil (absolute value of impedance of a speaker coil or resistance value of a speaker coil). As is shown in FIG. 1B, generally a one to one corresponding relationship is formed between the temperature of a speaker coil and the magnitude of impedance of a speaker coil. As a result, it is possible to estimate the temperature of a speaker coil from the magnitude of impedance of a speaker coil.

For example, in the case where a speaker is installed in a room and not operated and where room temperature ($T_1$) (for example 25° C.) and the temperature of a speaker coil are equal, the magnitude of impedance of the speaker coil is measured by an impedance calculation circuit explained below. In addition, the magnitude of the impedance ($I_1$) and room temperature ($T_1$) are correlated and stored in advance in a storage area such as a non-volatile memory included in a speaker control device and the like. As a result, the magnitude of the speaker coil impedance is calculated using an impedance calculation circuit while the speaker is in operation. It is possible to estimate the temperature of a speaker coil from the magnitude of the calculated impedance by referring to the relationship between the magnitude of the speaker coil impedance and speaker coil temperature as is shown in FIG. 1B.

Furthermore, it was explained here that one numerical value 25° C. was determined as an example of room temperature ($T_1$). However, the temperature is not limited to this. One numerical value can be selected from a plurality of temperature numerical values, and the selected numerical value can be correlated with the magnitude of the measured speaker coil impedance and stored.

In this way, it is possible to make a thermometer for measuring the temperature within a room unnecessary by storing the magnitude of speaker coil impedance at room temperature.

Figure 2:
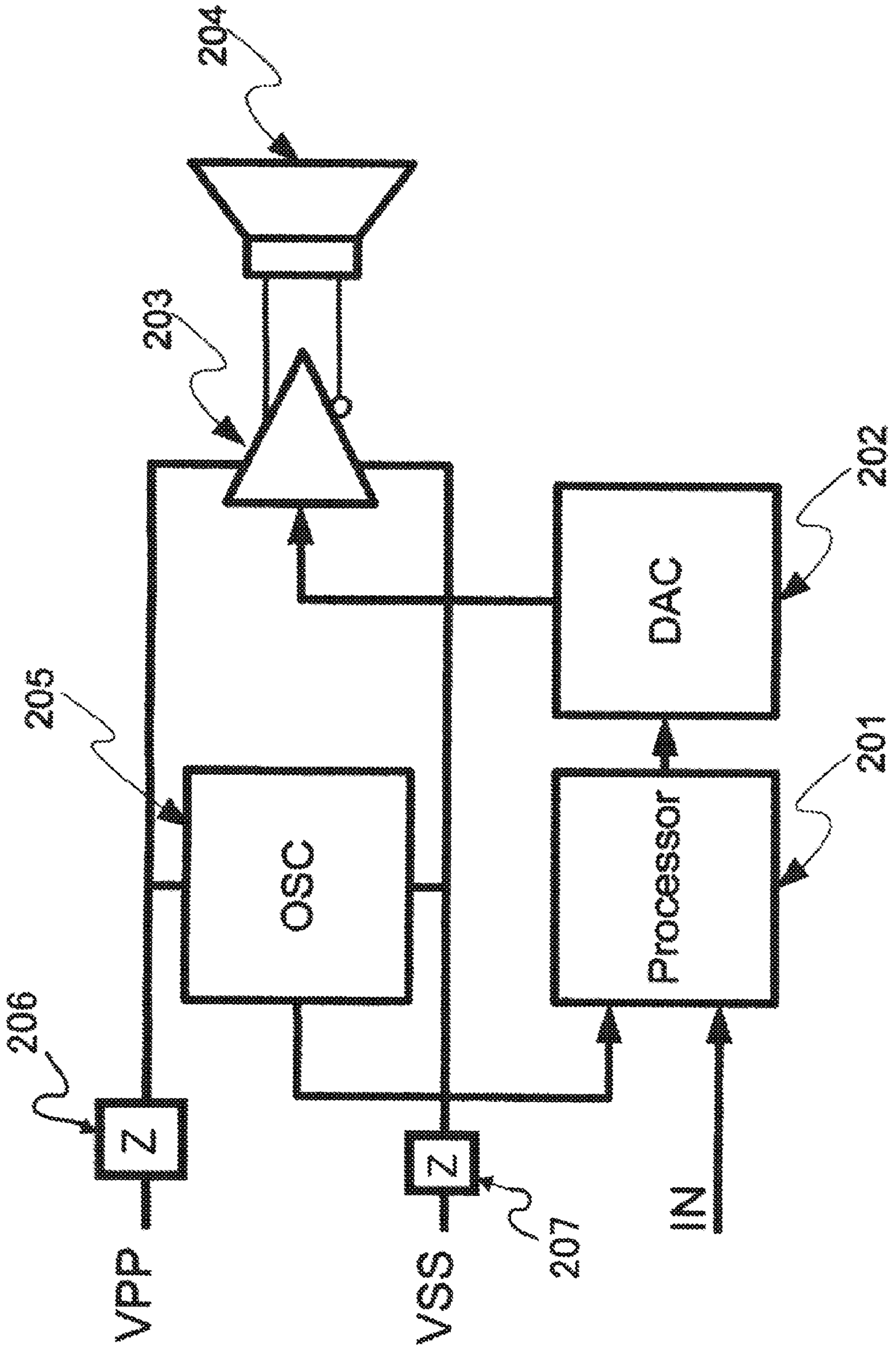
FIG. 2 is a schematic diagram of a speaker control device related to a first embodiment of the present invention.

The structure of a speaker control device related to the first embodiment of the present invention is shown in FIG. 2. The speaker control device shown in FIG. 2 includes a digital signal IN, a digital signal processing device (201), a digital-analog conversion device (202), an analog amplifier (203) and a speaker (204). The digital-analog conversion device (202) converts a digital signal from the digital signal processing device to an analog signal. The analog amplifier (203) is arranged between VPP/VSS which are drive power supply terminals, and amplifies the analog signal. Furthermore, a drive power supply can generally be a direct current power supply. In this case, VPP/VSS refer to direct current power supply terminals. In addition, the digital signal IN can be a signal which expresses an audio signal as a digital signal. The analog amplifier (203) is sometimes referred to as a drive circuit for driving the speaker (204) by supplying an amplified analog signal to the speaker (204). In addition, the speaker control device shown in FIG. 2 can feedback a clock from an oscillator (205) connected between VPP/VSS which are the drive power supply terminals to the digital signal processing device (202). Furthermore, as is shown in FIG. 2, the oscillator (205) can be connected in parallel with the analog amplifier (203) between VPP/VSS which are the drive power supply terminals. The symbols 206 and 207 show the presence of wire resistance within an LSI of VPP/VSS which are the drive power supply terminals, or parasitic resistance calculated from wires used in the connection between a package and LSI.

Furthermore, the oscillator (205) is not limited to being connected in parallel with the analog amplifier (203) between VPP/VSS. For example, in the case of a plurality of elements connected in series with respect to the analog amplifier (203) wherein a voltage between VPP/VSS is applied to both ends of the plurality of elements connected in series, it is possible to connect the oscillator (205) in parallel with one or two or more elements connected in series among the plurality of elements.

Figure 3A:
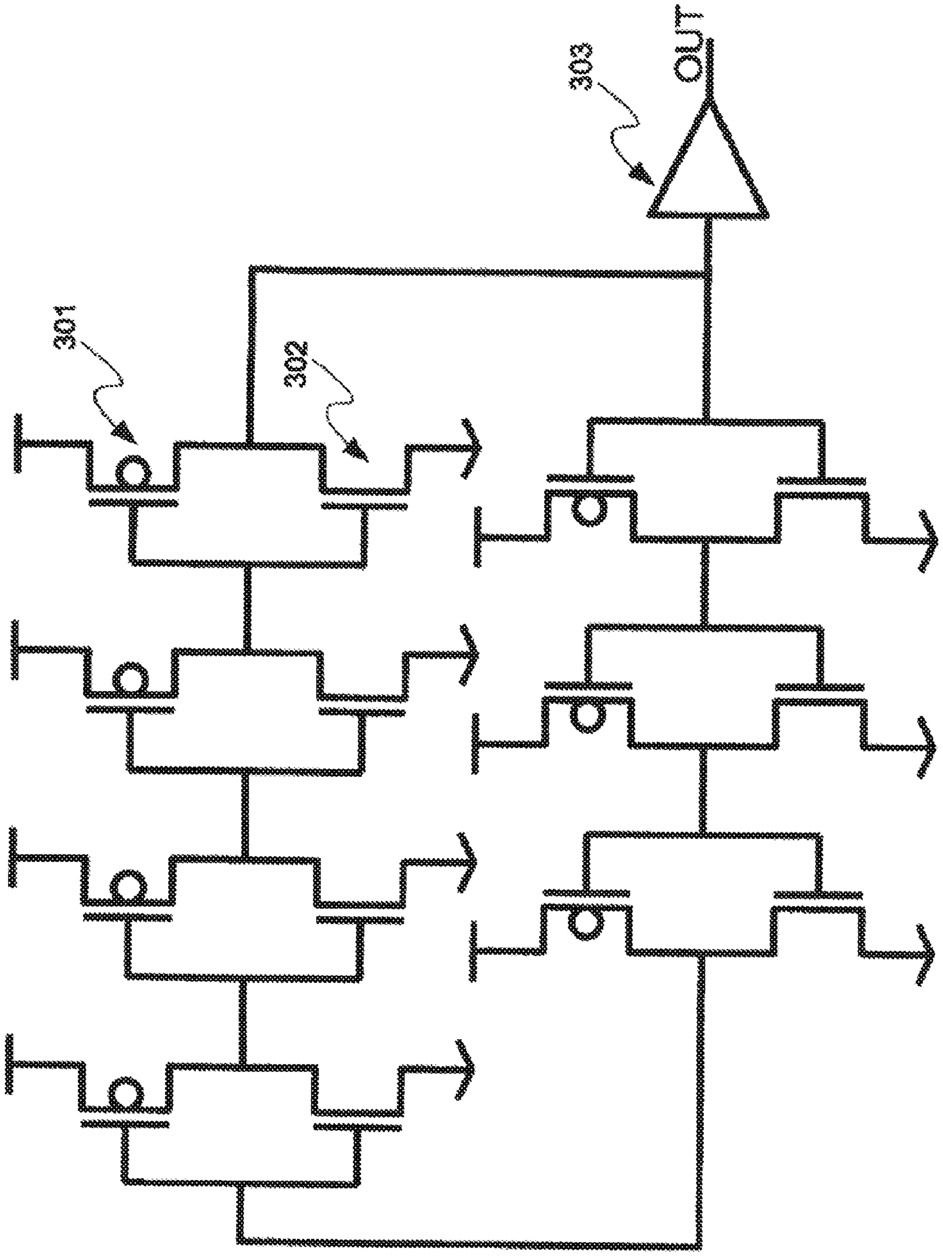
FIG. 3A is a schematic diagram of an oscillator which can be used in one embodiment of the present invention.

The structure on an oscillator which can be used in the present embodiment is shown in FIG. 3A. The oscillator shown in FIG. 3A is a ring oscillator device in which an inverter circuit is connected in a ring shape and includes PMOS transistor (301) and NMOS transistor (302) connected to VPP/VSS which are drive power supply terminals. Here, an odd number stage inverter circuit is used. Generally, a ring oscillator device includes a level conversion device (300) which performs level conversion of an oscillation signal of an oscillator of VPP/VSS amplitude which are drive power supply terminals to a digital signal.

In FIG. 3A, a ring oscillator device using an inverter circuit formed from a PMOS transistor and NMOS transistor is shown as an example of an oscillator. It is also possible to use a ring oscillator or multi-vibrator type oscillator using a differential input output type inverting amplifier as another example of an oscillator. The effects of the preset invention are not lost due to any difference in the structure of an oscillator.

In the first embodiment, a large drive current flows between VPP/VSS which are drive power supply terminals when an analog amplifier drives a speaker using a large amplitude signal. Generally, since the rated impedance of a speaker is 4Ω~8Ω, an output of about 2 W~4 W can be obtained if the voltage between VPP/VSS which are drive power supply terminals is set at 6V. The current flowing in a power supply wire at this time becomes 1 A~0.5 A.

Generally, wire resistance within an LSI of VPP/VSS which are drive power supply terminals, and parasitic resistance calculated from wires used in the connection between a package and LSI are both about 10 mΩ~30 mΩ. As a result, when a current of about 1 A~0.5 A flows in a wire, a drop in voltage of about 5 mV~30 mV occurs. If a power supply voltage is 6V, the drop in power supply is about 0.1%~0.5%. On the other hand, if the oscillation frequency of an oscillator arranged between VPP/VSS which are drive power supply terminals is sufficiently high, it is possible to sufficiently measure a variation in frequency due to a drop in voltage. Furthermore, in FIG. 2 described above, the presence of wire resistance within an LSI of VPP/VSS which are drive power supply terminals, and parasitic resistance calculated from wires used in the connection between a package and LSI are shown by the symbols 206 and 207. Therefore, elements shown by the symbols 206 and 207 sometimes do not actually exist independently.

Thus, in the present embodiment, the digital signal processing device (201) monitors variation in an oscillation frequency of the oscillator (205). If the digital signal processing device (201) detects a variation including a drop in voltage which exceeds an allowable value when a variation in oscillation frequency of the oscillator (205) is detected, the analog amplifier (203) also operates as a control circuit which performs an adjustment including reducing the amount of current supplied to a coil of the speaker (204). An adjustment of an amount of current supplied to a coil of the speaker (204) is sometimes called a feedback operation. Here, an allowable value is a voltage value determined in advance, and when a variation in a voltage which exceeds this voltage value persists, the amount of current supplied to a coil of the speaker (204) increases and is a value at which mechanical damage to the speaker (204) occurs. Therefore, it is possible to prevent mechanical damage to the speaker (204) by the feedback operation described above.

In particular, when a signal in the vicinity of a resonance frequency f0 of the speaker is input to a speaker device, if the digital signal processing device detects that a variation in an oscillation frequency of an oscillator has exceeded a threshold value, it is possible to prevent mechanical damage to the speaker by reducing the amount of current flowing in a coil of the speaker by controlling the gain of a digital signal to be reduced within the digital signal processing device.

Generally, a signal expressing audio to be output by the speaker (204) is divided by frequency using a bandpass filter in advance, and it is possible to form a digital signal processing device to perform a feedback operation only when the frequency of the speaker output becomes the resonance frequency f0 or within that vicinity. For example, the digital signal processing device (201) divides in advance an audio signal expressed by the digital signal IN (input signal) by frequency using a bandpass filter, and as a result it is possible to form a digital signal processing device to perform a feedback operation when the resonance frequency f0 of the speaker or a frequency within that vicinity is detected.

In addition, a Fast Fourier Transform (FFT) analysis of a change amount of a frequency of alternating signal from an oscillator is performed, and it is possible to form a digital signal processing device so that an feedback operation is performed using a change amount of a resonance frequency f0 of a speaker on a frequency axis or a change amount in a frequency band including a frequency in this vicinity.

In the first embodiment, although control is performed so that the gain of a digital signal within a digital signal processing device increases and decreases regardless of the frequency, for example it is possible to selectively increase and decrease the gain of a signal with a low frequency less than a certain frequency. The present invention can be realized regardless of a difference in the control structure of a gain within a digital signal processing device.

Figure 3B:
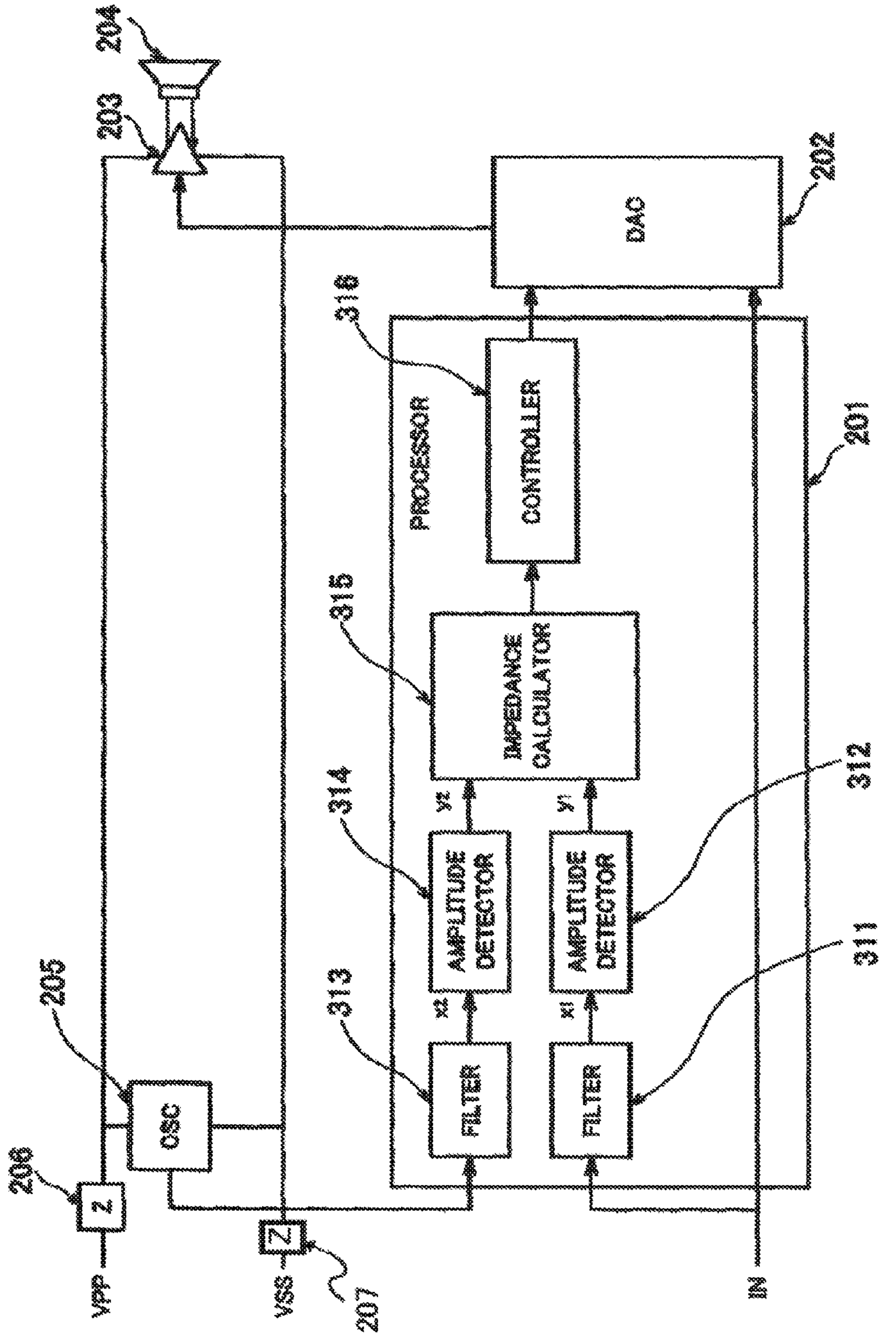
FIG. 3B is a schematic diagram of a speaker control device related to a first embodiment of the present invention.

FIG. 3B shows an internal structure of the digital signal processing device (201) and the structure of a speaker control device related to the present embodiment. In FIG. 3B, the digital signal processing device (201) is arranged with a first filter circuit (311), a first amplitude detection circuit (312), a second filter circuit (313), a second amplitude detection circuit (314), an impedance calculation circuit (315) and a control circuit (316).

The first filter circuit (311) performs filtering of a digital signal having a specific frequency component from a digital signal IN input to the digital signal processing device (201). For example, the first filter circuit (311) can be realized using a bandpass filter. In addition, the first filter circuit (311) can be realized by applying a Fourier conversion represented by FFT for example to the digital signal IN, and by a circuit which extracts a signal with a specific frequency component.

The first amplitude detection circuit (312) detects the magnitude ($y_1$) of an amplitude of a signal ($x_1$) filtered by the first filter circuit (311). As a specific example, the first amplitude detection circuit (312) can detect a value corresponding to a voltage of a specific frequency component of the digital signal IN.

The second filter circuit (313) performs filtering of a digital signal with a specific frequency component from a signal output by the oscillator (205). It is preferred that a frequency component filtered by the first filter circuit (311) and a frequency component filtered by the second filter circuit (313) are the same. Therefore, it is possible to form the second filter circuit (313) using a similar structure as the first filter circuit (311). In addition, a first fourier transform (FFT) analysis may be applied to a change amount of a frequency of an alternating signal from the oscillator (205) and a specific frequency component may be extracted.

The second amplitude detection circuit (314) detects the magnitude ($y_2$) of an amplitude of a signal ($x_2$) filtered by the second filter circuit (313). In the present embodiment, a value of amplitude of a signal filtered by the second filter circuit (313) can be corresponded with a value of a current flowing in the analog amplifier circuit (203) at a specific frequency component.

By making the frequency component (filter pass band frequency) filtered by the first filter circuit (311) and the frequency component filtered by the second filter circuit (313) substantially the same, it is possible to calculate a correlation between a signal input to the first filter circuit (311) and a signal input to the second filter circuit (313). In an AB class or D class, the waveform of a current waveform becomes a full-wave rectified waveform, and twice the frequency of an input frequency. In this case, while considering this it is also possible to change a filter pass band frequency.

The impedance calculation circuit (315) calculates a value corresponding to the magnitude of impedance of the analog amplifier circuit (203) at a specific frequency component from a value of an amplitude detected by the first amplitude detection circuit (312) and a value of an amplitude detected by the second amplitude detection circuit (313). As described above, the value of an amplitude detected by the first amplitude detection circuit (312) is a value corresponding to a voltage of a specific frequency component, and the value of an amplitude detected by the second amplitude detection circuit (314) is a value corresponding to a value of a current flowing through the analog amplifier circuit (203) at a specific frequency component. Therefore, by calculating $y_1/y_2$, it is possible to calculate a value corresponding to the magnitude of impedance of the analog amplifier circuit (203) at a specific frequency component.

Furthermore, in the case where the analog amplifier circuit (203) is a switching circuit etc. for controlling the magnitude of a current flowing in a coil of the speaker (204), it is possible to consider the magnitude of the impedance of the analog amplifier circuit (203) as the magnitude of the impedance of the coil of the speaker (204).

The control circuit (316) controls the magnitude of an output to the analog amplifier (203) of the digital analog conversion device (202) according to the result (value corresponding to the magnitude of impedance) of a calculation by the impedance calculation circuit (315). Specifically, the control circuit (316) estimates the temperature of a coil from a value corresponding to the magnitude of impedance calculated by the impedance calculation circuit (315) by referring to the relationship between the coil temperature and the magnitude of impedance shown in FIG. 1B. If the estimated temperature is higher than a predetermined temperature, the output to the analog amplifier (203) of the digital analog conversion device (202) is reduced or the output is terminated. For example, a signal which reduces the output of the digital analog conversion device (202) is transmitted to the digital analog conversion device (202) and although not shown in FIG. 3B, the magnitude of the digital signal IN itself is reduced. Furthermore, it is possible to reduce the output to the analog amplifier (203) of the digital analog conversion device (202) according to the impedance calculated by the impedance calculation circuit (315) or can terminate the output. In other words, it is possible to control the output to the analog amplifier (203) of the digital analog conversion device (202) based on the value of impedance calculated by the impedance calculation circuit (315) without estimating temperature.

Figure 3C:
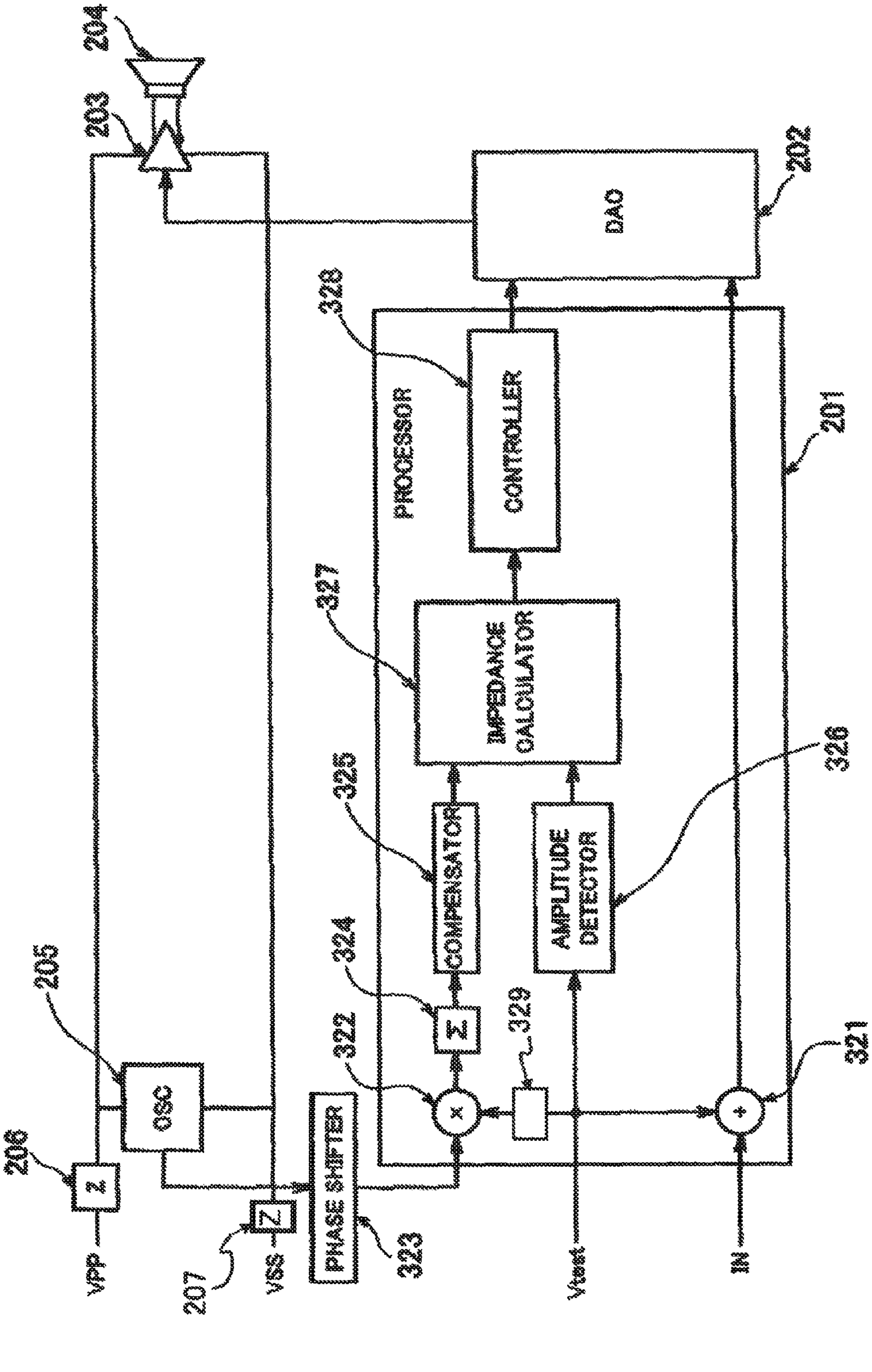
FIG. 3C is a schematic diagram of a speaker control device related to a first embodiment of the present invention.

FIG. 3C shows another internal structure of the digital signal processing device (201) and the structure of a speaker control device related to the present embodiment. In FIG. 3C, the digital signal processing device (201) is arranged with an adder (321), a multiplier (322), an integrator (324), a correction circuit (325), an amplitude detection circuit (326), an impedance calculation circuit (32) and a control circuit (328).

The adder (321) adds a test digital signal Vtest to a digital signal IN and outputs the result. The test digital signal Vtest is a signal including a predetermined frequency component. For example, the test digital signal Vtest may also be a signal including a resonance frequency of a speaker. In addition, the test digital signal Vtest may also be a signal of a frequency other than a resonance frequency of a speaker.

In the case shown in FIG. 3C, since the test digital signal Vtest is added to a digital signal IN and output to the digital analog conversion device (202), audio expressed by the test digital signal Vtest is replayed from the speaker (204) and replay sometimes deteriorates. As a result, the test digital signal Vtest may also be a 1 hertz signal, an audio signal in the ultrasonic range or a signal other than the audible range.

In addition, the test digital signal Vtest may also be the same signal as the digital signal IN. In this case, it is possible to eliminate deterioration of replay using the test digital signal Vtest. However, when the digital signal IN represents silence or does not include a frequency related to a calculation of impedance, since impedance cannot be calculated, in this case the test digital signal Vtest may be input separately to the digital signal IN.

The multiplier (322) performs multiplication of a signal output by the oscillator (205) and the test digital signal Vtest and outputs the result. In other words, a correlation between a signal output by the oscillator (205) and the test digital signal Vtest is calculated by the multiplier (322). In addition, among the signals output by the oscillator (205), a frequency component of the test digital signal Vtest is output. Furthermore, a phase between a signal output by the oscillator (205) and the test digital signal Vtest may be adjusted. For example, as is shown in FIG. 3C, the phase of a signal output by the oscillator (205) may be made the same as the phase of the test digital signal Vtest by a phase conversion device (323). In the case where the amplifier (203) is AB class, D class or some other switching amplifier, the current waveform becomes a waveform in which the current flowing to the speaker is full-wave rectified. As a result, the Vtest signal multiplied by the multiplier (322) also becomes a full-wave rectified waveform by being combined with the current flowing to the speaker. In addition, in order to adjust the magnitude of a signal output by the oscillator (205) and the magnitude of the test digital signal Vtest, as is shown in FIG. 3C, the test digital signal Vtest is input to the correction circuit (329), and the multiplier (322) may multiply the signal output by the oscillator (205) (or a signal output by the phase conversion device (323)) with the output of the correction circuit (329).

The integrator (324) integrates the output of the multiplier (322). For example, integration during a predetermined time interval $T_1$ is calculated and output.

The correction circuit (325) performs correction of the output of the integrator (324) according to the value of the test digital signal Vtest. For example, a value output by the integrator (324) is subtracted from $T_1$ and a value subtracted from the magnitude of the test digital signal Vtest is calculated and output.

The amplitude detection circuit (326) detects the magnitude of the amplitude of the test digital signal Vtest. In this way, it is possible to detect a value corresponding to a voltage of the frequency component of the test digital signal Vtest.

The impedance calculation circuit (327) calculates a value corresponding to the magnitude of impedance of the analog amplifier (203) at a specific frequency component using the output of the amplitude detection circuit (326) and the output of the correction circuit (325). Since the calculation is the same as the impedance calculation circuit (315) described above in the case where the output of the amplitude detection circuit (326) is given as $y_1$, and the output of the correction circuit (325) is given as $y_2$, an explanation is omitted.

Since the control circuit (327) is also the same as the control circuit (316), an explanation is omitted.

Figure 4A:
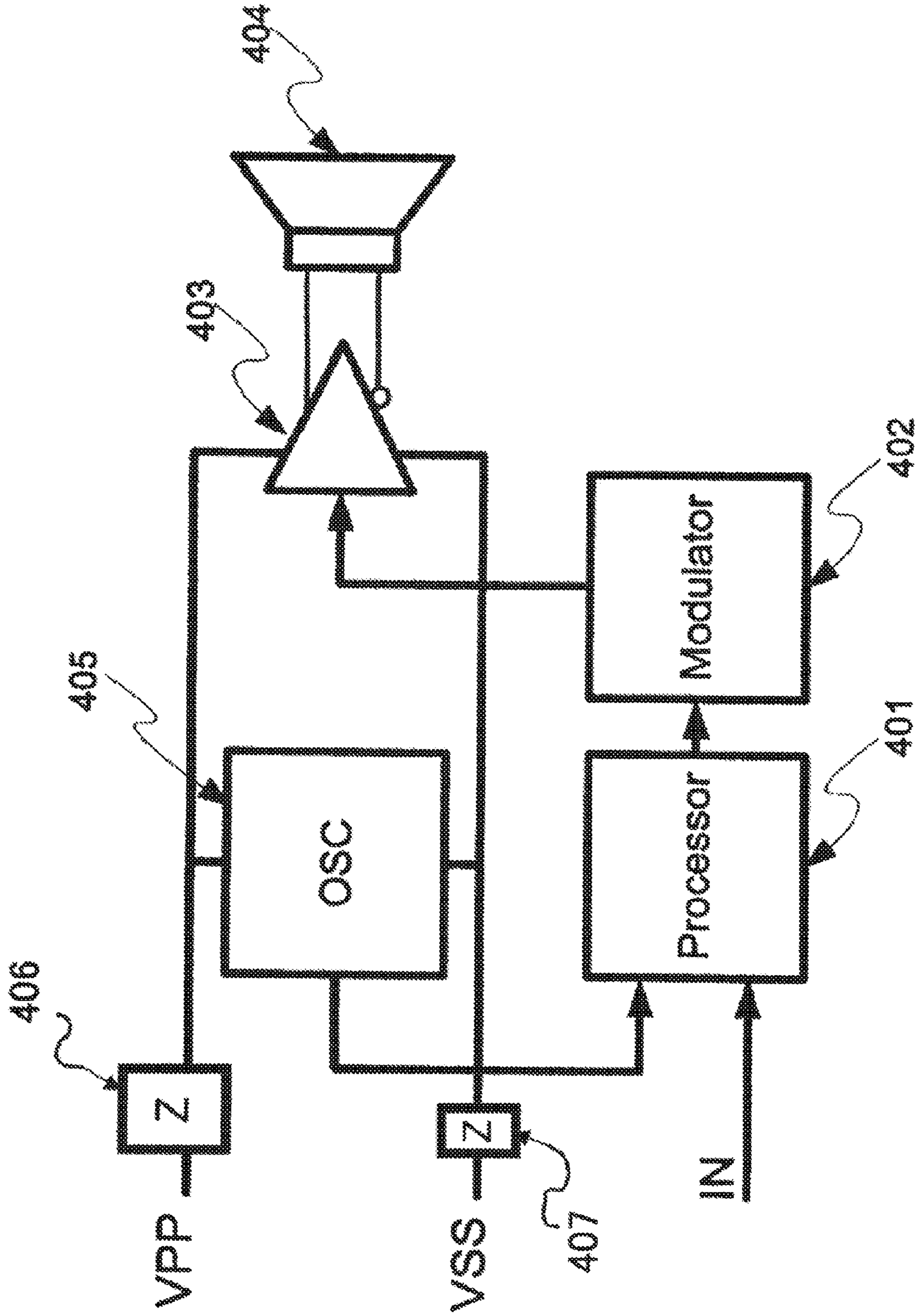
FIG. 4A is a schematic diagram of a speaker control device related to a second embodiment of the present invention.

A structure related to a second embodiment of the present invention is shown in FIG. 4A. The speaker control device shown in FIG. 4A includes a digital signal IN, a digital signal processing device (401), a modulator (402), a drive switching device (403) and a speaker (404). The modulator (402) converts a digital signal from the digital signal processing device to a 3 value (+1, 0, −1) digital signal for example. The drive switching device (403) is connected between VPP/VSS which are drive power supply terminals and amplifies a digital signal. In this case, the digital signal which the drive switching device (403) amplifies may also be a 3 value (+1, 0, −1) digital signal. The drive switching device (403) supplies the amplified digital signal to the speaker (404) and is sometimes referred to as a drive circuit for driving the speaker (404). In addition, the speaker control device can feed back a clock from the oscillator (405) connected the same as in the first embodiment between VPP/VSS which are the drive power supply terminals, to the digital signal processing device (402). That is, it is possible to connect the oscillator (405) in parallel with the drive switching device (403) between VPP/VSS which are the drive power supply terminals. Furthermore, the same as in FIG. 2, the presence of wire resistance within LSI of VPP/VSS which are the drive power supply terminals, and the presence of parasitic resistance obtained as a total of wires used in connecting a package and LSI are shown by the symbols 406 and 407.

Figure 4B:
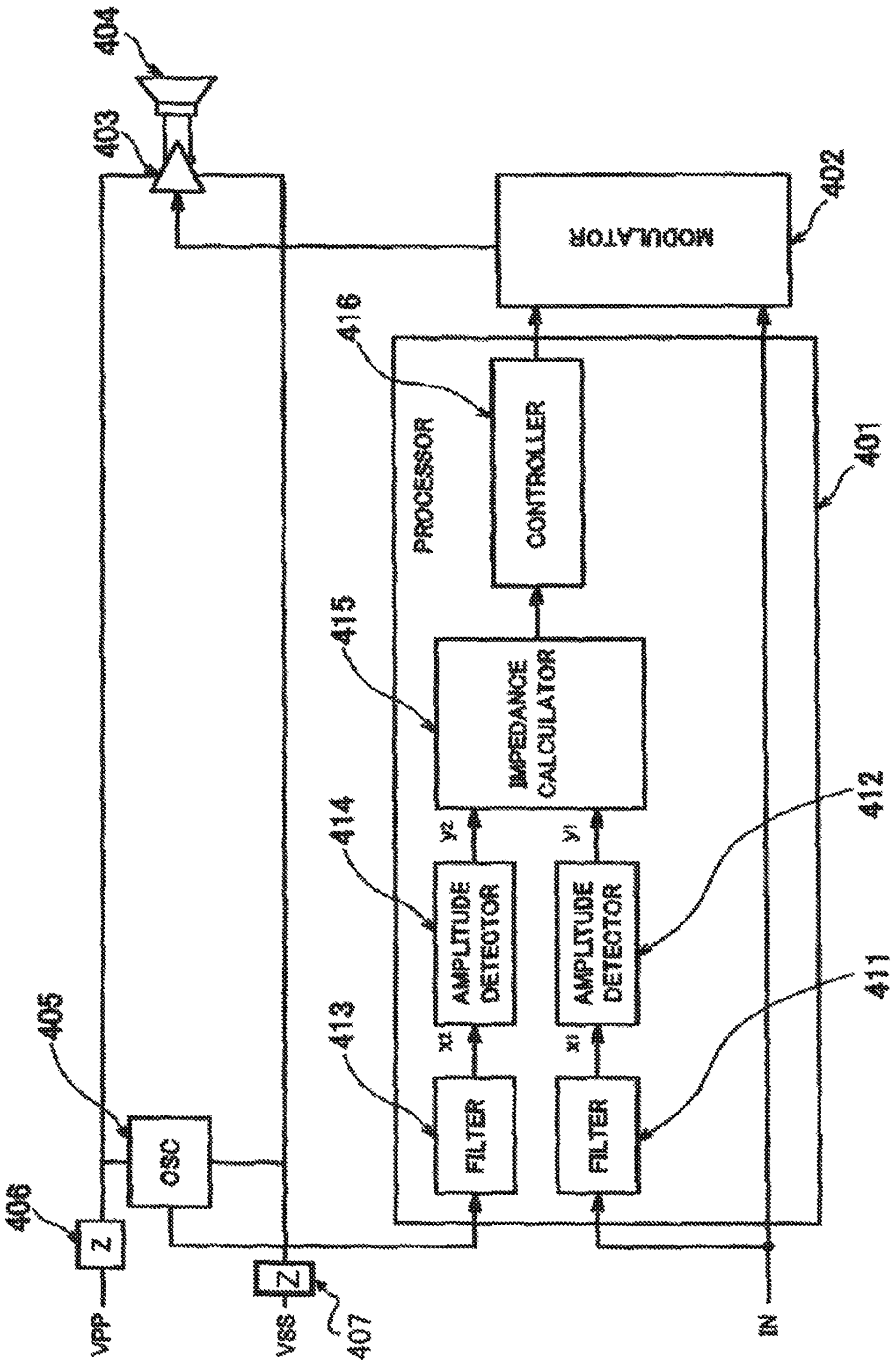
FIG. 4B is a schematic diagram of a speaker control device related to a second embodiment of the present invention.

FIG. 4B shows an internal structure of the digital signal processing device (401) and the structure of a speaker control device related to the present embodiment. In FIG. 4B, the digital signal processing device (401) is arranged with a first filter circuit (411), a first amplitude detection circuit (412), a second filter circuit (413), a second amplitude detection circuit (414), an impedance calculation circuit (415) and a control circuit (416).

The first filter circuit (411) performs filtering of a digital signal of a specific frequency component from a digital signal IN input to the digital signal processing device (201). For example, the first filter circuit (411) can be realized using a bandpass filter. In addition, the first filter circuit (411) can also be realized by applying fourier conversion represented by FFT and the like to the digital signal IN, and a circuit which extracts a signal of a specific frequency component.

The first amplitude detection circuit (412) detects the magnitude ($y_1$) of an amplitude of a signal ($x_1$) filtered by the first filter circuit (411). As a specific example, the first amplitude detection circuit (412) can detect a value corresponding to a voltage of a specific frequency component of the digital signal IN.

The second filter circuit (413) performs filtering of a digital signal of a specific frequency component from a signal output by the oscillator (405). It is preferred that the frequency component filtered by the first filter circuit (411) and the frequency component filtered by the second filter circuit (413) are the same. Therefore, the second filter circuit (413) can be realized using a similar structure as the first filter circuit (411). In addition, a FFT analysis may be applied to a change amount of a frequency of an alternating signal from the oscillator (205) and a specific frequency component may be extracted. In the case where the drive switching device (403) is a H bridge (full bridge type), since a current has a waveform which becomes a waveform after a current flowing to a speaker is full-wave rectified, the frequency becomes twice that of an input frequency. In this case, while considering this a pass band frequency of a filter or detection frequency at FFT may be changed.

The second amplitude detection circuit (414) detects the magnitude ($y_2$) of the amplitude of a signal ($x_2$) filtered by the second filter circuit (413). In the present embodiment, it is possible to correspond a value of amplitude filtered by the second filter circuit (413) with a specific frequency component of an input signal IN of a current value which is generated when the modulator (402) drives the drive switching device (403).

By making the frequency component filtered by the first filter circuit (411) and the frequency component filtered by the second filter circuit (413) substantially the same, it is possible to calculate a correlation between a signal input to the first filter circuit (411) and a signal input to the second filter circuit (413).

The impedance calculation circuit (415) calculates a value corresponding to the magnitude of impedance in a specific frequency component of the drive switching device (403) from a value of amplitude detected by the first amplitude detection circuit (412) and a value of amplitude detected by the second amplitude detection circuit (414). As described above, a value of an amplitude detected by the first amplitude detection circuit (412) is a value corresponding to a voltage of a specific frequency component, and a value of an amplitude detected by the second amplitude detection circuit (414) is a value corresponding to a value of a current flowing to the drive switching device (403) at a specific frequency component. Therefore, it is possible to calculate a value corresponding to the magnitude of impedance of the drive switching device (403) at a specific frequency component by calculating the value of $y_1/y_2$.

Since the drive switching device (403) supplies a current to the speaker (404), it is possible to consider the value calculated by the impedance calculation circuit (315) as the magnitude of the impedance of the speaker (404).

The control circuit (416) controls the magnitude of an output to the drive switching device (403) of the modulator (402) according to the result (value corresponding to the magnitude of impedance) of a calculation by the impedance calculation circuit (415). Specifically, the control circuit (416) estimates the temperature of a coil from a value corresponding to the magnitude of impedance calculated by the impedance calculation circuit (415) by referring to the relationship between the temperature of a coil and the magnitude of impedance as is shown in FIG. 1B. If the estimated temperature is higher than a predetermined temperature, the output to the drive switching device (403) of the modulator (402) is reduced or terminated. For example, a signal which reduces the output is transmitted to the modulator (402) and although not shown in FIG. 4B, the magnitude of the digital signal IN itself is reduced. Furthermore, it is possible to reduce or terminate the output to the drive switching device (403) of the modulator (402) according to the impedance calculated by the impedance calculation circuit (415). In other words, it is possible to control an output to the drive switching device (403) of the modulator (402) based on an impedance value calculated by the impedance calculation circuit (415) without estimating temperature.

Figure 4C:
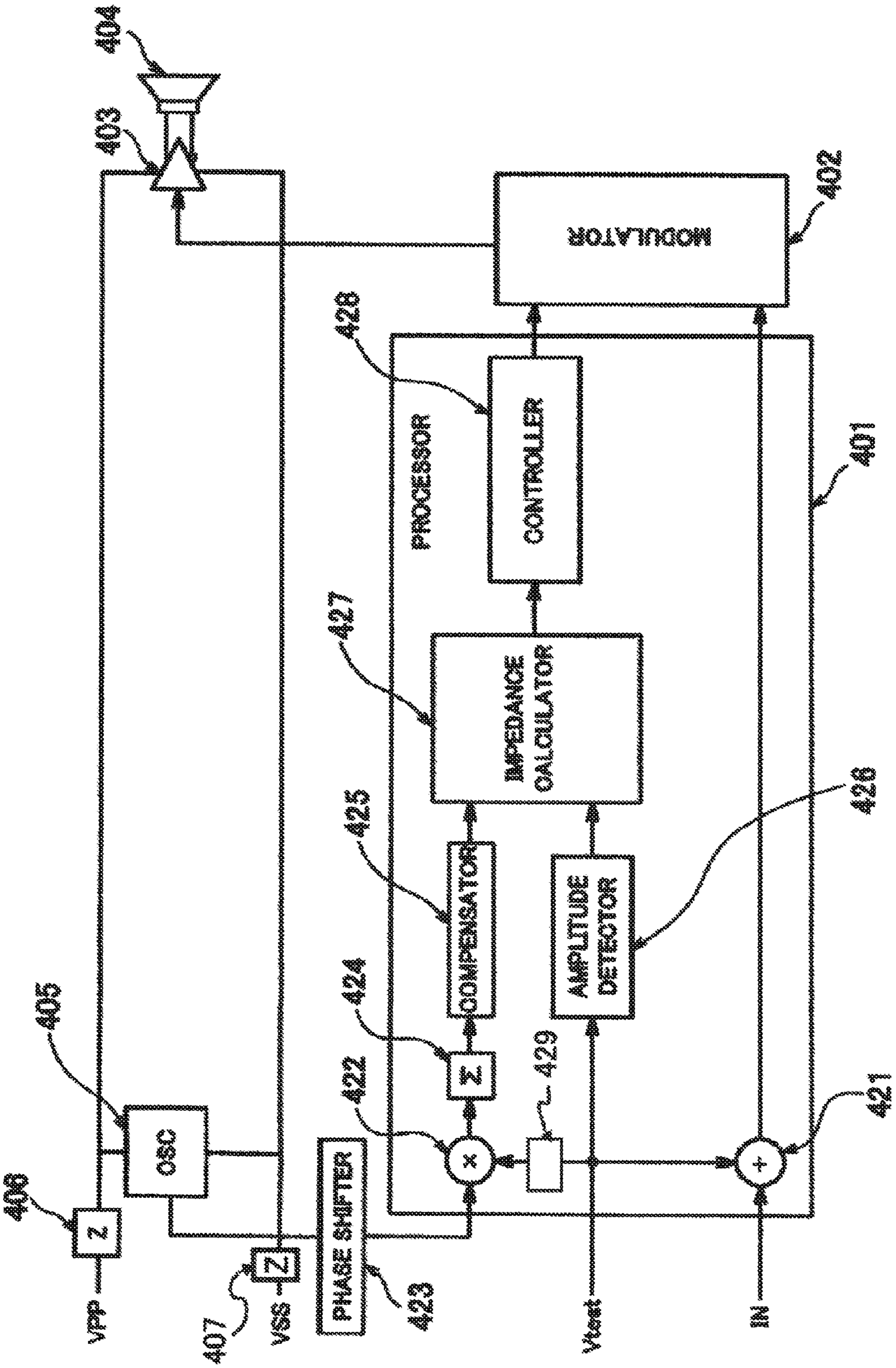
FIG. 4C is a schematic diagram of a speaker control device related to a second embodiment of the present invention.

FIG. 4C shows another internal structure of the digital signal processing device (401) and a structure of the speaker control device related to the present embodiment. In FIG. 4C, the digital signal processing device (401) is arranged with an adder (41), a multiplier (422), an integrator (424), an amplitude detection circuit (426), an impedance calculation circuit (427) and a control circuit (428).

The adder (421) adds a test digital signal Vtest to a digital signal IN and outputs the result. The test digital signal Vtest is a signal including a predetermined frequency component. For example, the test digital signal Vtest may also be a signal including a resonance frequency of a speaker. In addition, the test digital signal Vtest may also be a signal of a frequency other than a resonance frequency of a speaker.

In the case shown in FIG. 4C, since the test digital signal Vtest is added to a digital signal IN and output to the modulator (402), audio expressed by the test digital signal Vtest is replayed from the speaker (404) and replay sometimes deteriorates. As a result, the test digital signal Vtest may also be a 1 hertz signal, an audio signal in the ultrasonic range or a signal other than the audible range.

In addition, the test digital signal Vtest may also be the same signal as the digital signal IN. In this case, it is possible to eliminate deterioration of replay using the test digital signal Vtest. However, when the digital signal IN represents silence or does not include a frequency related to a calculation of impedance, since impedance cannot be calculated, in this case the test digital signal Vtest may be input separately to the digital signal IN.

The multiplier (422) performs multiplication of a signal output by the oscillator (405) and the test digital signal Vtest and outputs the result. In other words, a correlation between a signal output by the oscillator (405) and the test digital signal Vtest is calculated by the multiplier (422). In addition, among the signals output by the oscillator (405), a frequency component of the test digital signal Vtest is output. Furthermore, a phase between a signal output by the oscillator (405) and the test digital signal Vtest may be adjusted. For example, as is shown in FIG. 4C, the phase of a signal output by the oscillator (405) may be made the same as the phase of the test digital signal Vtest by a phase conversion device (423). In the case where 403 is an H bridge (full bridge type), the current waveform becomes a waveform in which the current flowing to the speaker is full-wave rectified. As a result, the Vtest signal multiplied by the multiplier (322) also becomes a full-wave rectified waveform by being combined with the current flowing to the speaker. In addition, in order to adjust the magnitude of a signal output by the oscillator (405) and the magnitude of the test digital signal Vtest, the test digital signal Vtest is input to the correction circuit (429), and the multiplier (422) may multiply the signal output by the oscillator (405) (or a signal output by the phase conversion device (423)) with the output of the correction circuit (429).

The integrator (424) integrates the output of the multiplier (422). For example, integration during a predetermined time interval $T_1$ is calculated and output.

The correction circuit (425) performs correction of the output of the integrator (424) according to the value of the test digital signal Vtest. For example, a value output by the integrator (424) is subtracted from $T_1$ and a value subtracted from the magnitude of the test digital signal Vtest is calculated and output.

The amplitude detection circuit (426) detects the magnitude of the amplitude of the test digital signal Vtest. In this way, it is possible to detect a value corresponding to a voltage of the frequency component of the test digital signal Vtest.

The impedance calculation circuit (427) calculates a value corresponding to the magnitude of impedance of the drive switching device (403) at a specific frequency component using the output of the amplitude detection circuit (426) and the output of the correction circuit (425). Since the calculation is the same as the impedance calculation circuit (415) described above in the case where the output of the amplitude detection circuit (426) is given as $y_1$, and the output of the correction circuit (425) is given as $y_2$, an explanation is omitted.

Since the control circuit (428) is also the same as the control circuit (416), an explanation is omitted.

Figure 4D:
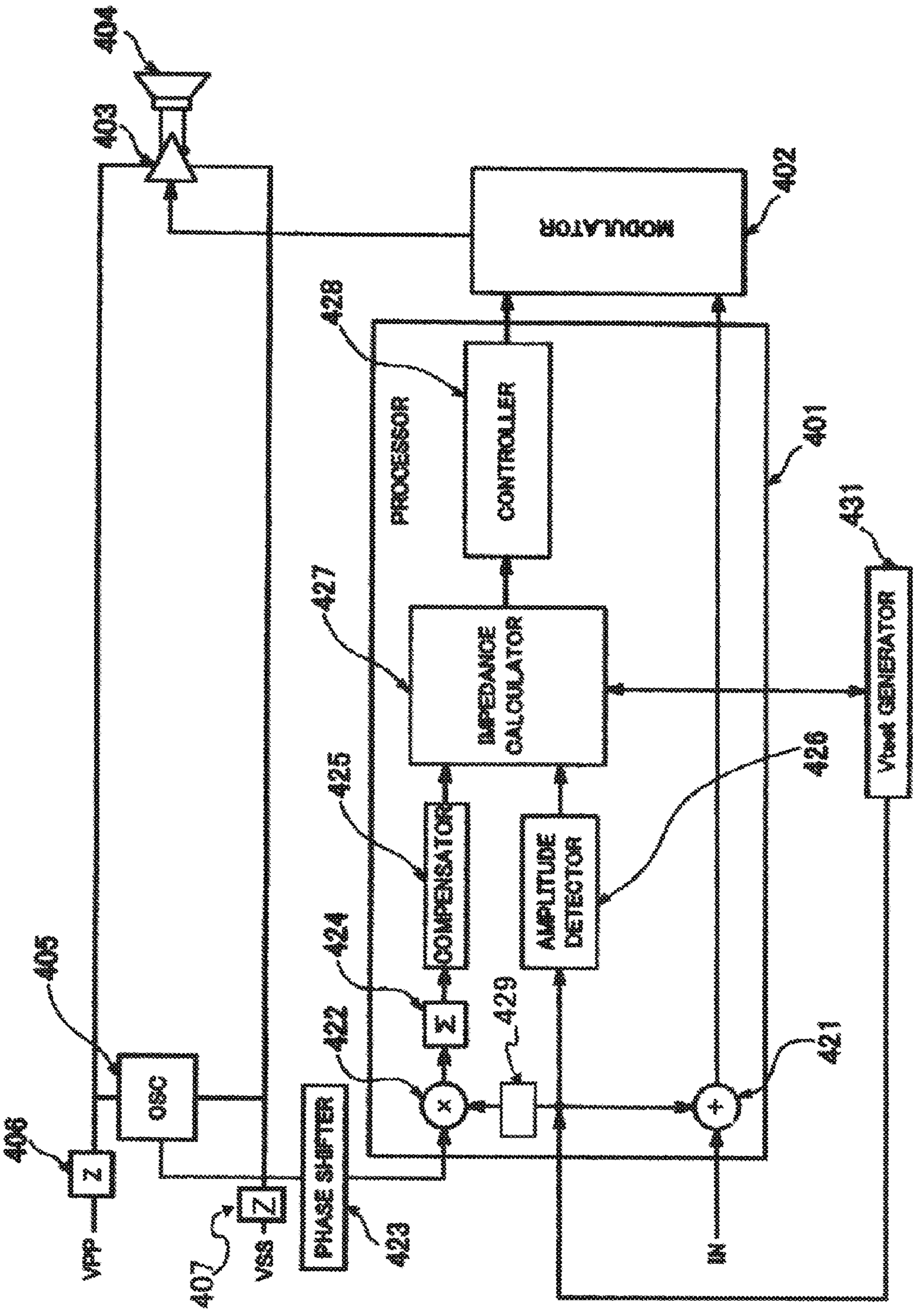
FIG. 4D is a schematic diagram of a speaker control device related to a second embodiment of the present invention.

Furthermore, as is shown in FIG. 4D the test digital signal Vtest may be generated by a Vtest generation circuit (431). In this case, the Vtest generation circuit (431) repeatedly refers to a calculation result of the impedance calculation circuit (427) while changing the frequency of the test digital signal Vtest, and it is possible to calculate a resonance frequency by calculating the frequency when the calculation result of the impedance calculation circuit (427) becomes an extreme value (maximum value or minimum value). After the resonance frequency is calculated, the Vtest generation circuit (413) uses the calculated resonance frequency as a frequency of the test digital signal Vtest. In this way, it is possible to detect a change in the impedance of a speaker at a high level of accuracy.

Figure 5A:
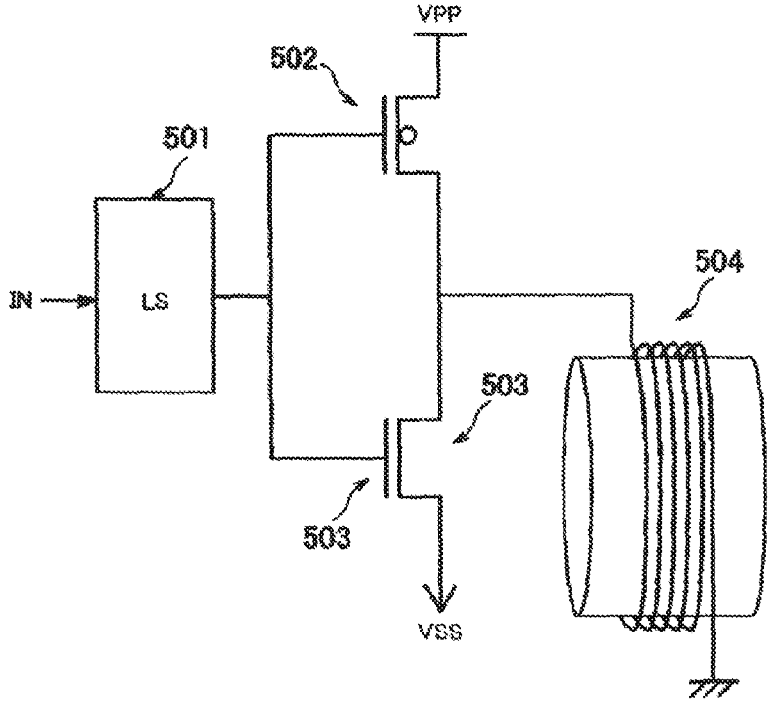
FIG. 5A is a schematic diagram of a drive switching device which can be used in one embodiment of the present invention.

An example of a structure of a drive switching device which can be used in one embodiment of the present invention is shown in FIG. 5A. The drive switching device with the structure shown in FIG. 5A includes a level shift circuit (501) and an inverter circuit. The level shift circuit (501) corresponds a digital signal to a voltage of VPP/VSS which are drive power supply terminals. The inverter circuit includes a PMOS transistor (502) and NMOS transistor (503) connected to VPP/VSS which are drive power supplies. One end of a speaker coil (504) is connected to a center point of a connection between the PMOS transistor (502) and NMOS transistor (503).

As described above, it is possible to connect an oscillator in parallel with the PMOS transistor (502) and NMOS transistor (503) between VPP/VSS. In one embodiment of the present invention, it is possible to connect an oscillator in parallel with the PMOS transistor (502). In addition, it is possible to connect an oscillator in parallel with the NMOS transistor (503).

Figure 5B:
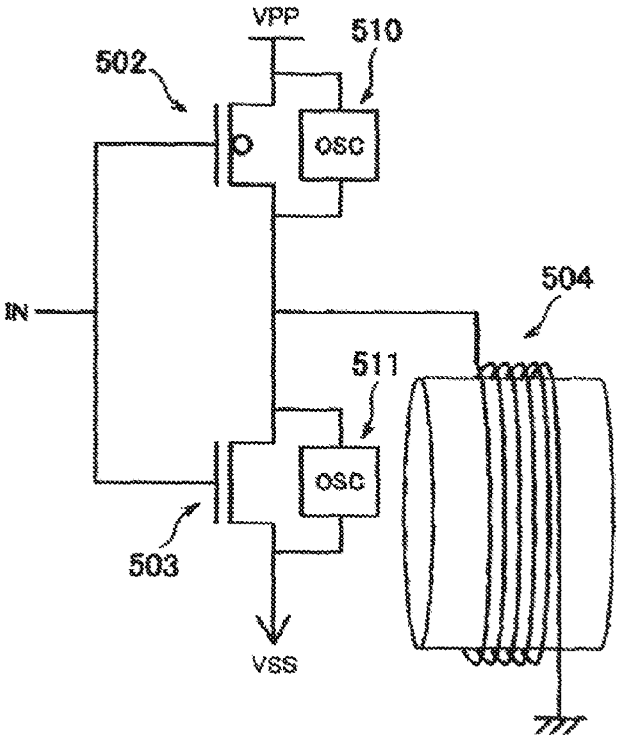
FIG. 5B is a schematic diagram of a drive switching device which can be used in one embodiment of the present invention.

For example, as is shown in FIG. 5B, the oscillator (510) is connected to the drain terminal and source terminal of the PMOS transistor (502) and it is possible to connect the oscillator (510) and PMOS transistor (502) in parallel. In addition, it is possible to connect the oscillator (511) to the drain terminal and source terminal of the NMOS transistor (503) and connect the oscillator (511) and NMOS transistor (503) in parallel. In this case, when the PMOS transistor (503) is ON, the NMOS transistor (504) is OFF and the oscillator (511) oscillates. In addition, reversely when the PMOS transistor (503) is OFF, the NMOS transistor (504) is ON and the oscillator (510) oscillates. Therefore, the oscillator (510) and oscillator (511) do not oscillate at the same time in principle and it is possible to synthesize the outputs of the oscillator (510) and oscillator (511) and input to the digital signal processing device (601).

Furthermore, although the oscillator (510) and oscillator (511) are shown in FIG. 5B, either one may also be used.

Figure 5C:
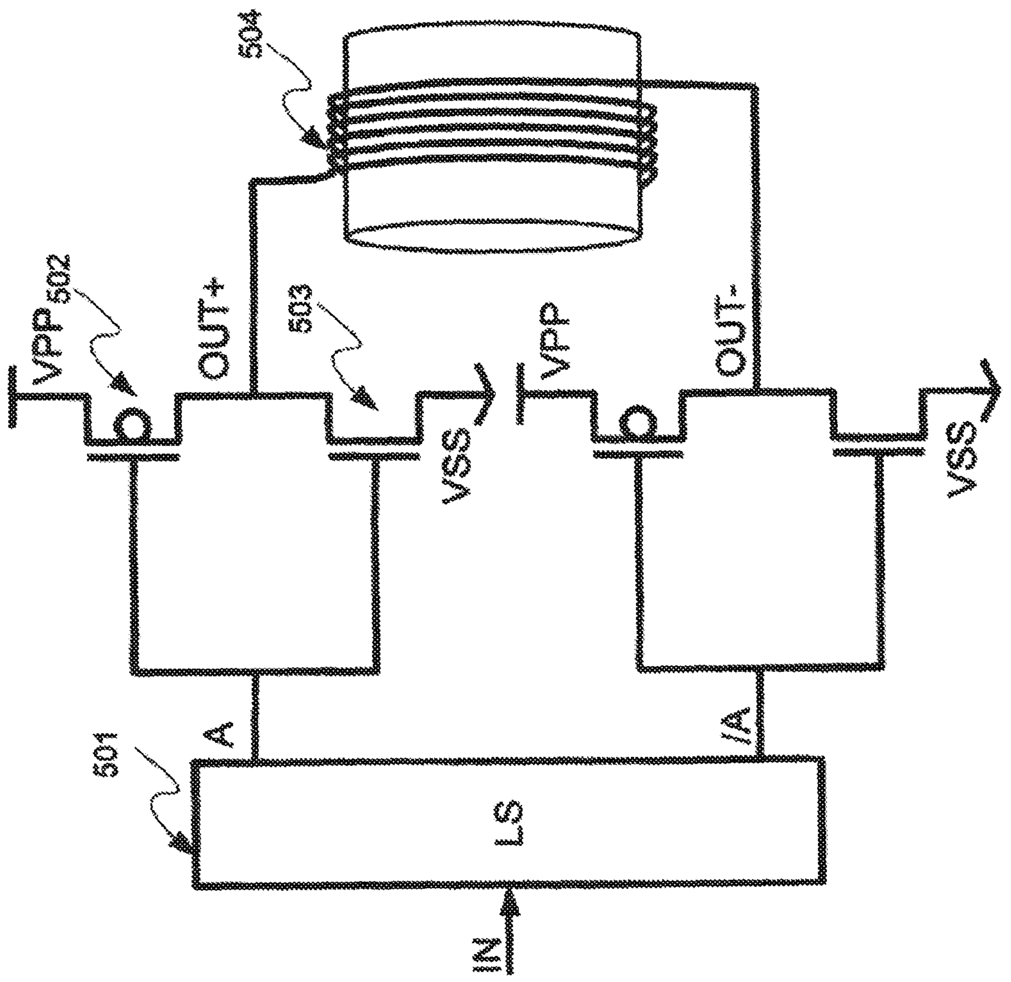
FIG. 5C is a schematic diagram of a drive switching device which can be used in one embodiment of the present invention.

An example of a structure of a drive switching device which can be used in one embodiment of the present invention is shown in FIG. 5C. The drive switching device with the structure shown in FIG. 5C includes a level shift circuit (501) and an inverter circuit. The level shift circuit (501) corresponds a digital signal to a voltage of VPP/VSS which are drive power supply terminals. The inverter circuit includes a PMOS transistor (502) and NMOS transistor (503) connected to VPP/VSS which are drive power supplies. Generally, a full bridge type drive circuit is formed by connecting the speaker coil (504) between OUT+ and OUT−. Furthermore, a digital input signal can be an output of the modulator (402).

Figure 5D:
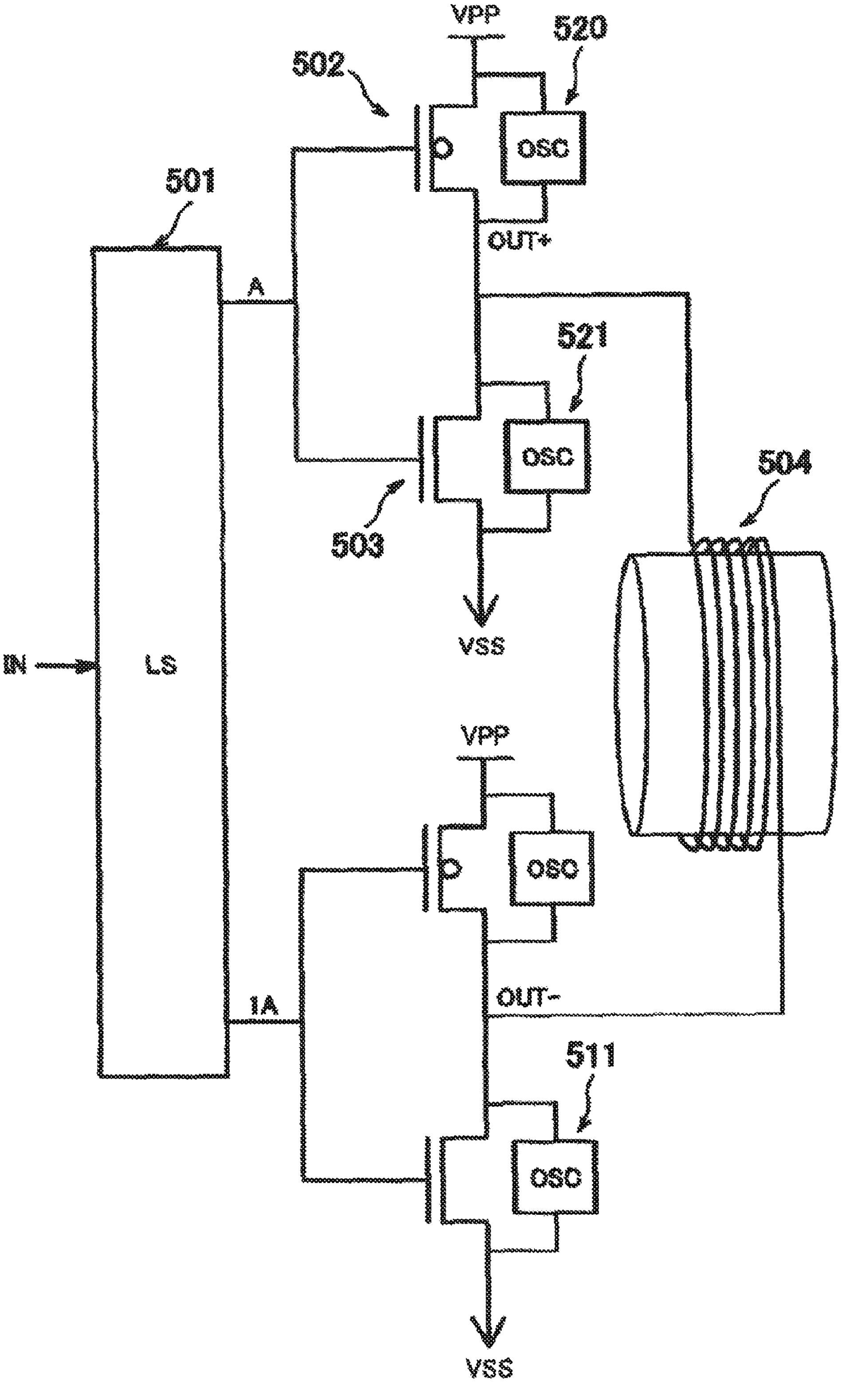
FIG. 5D is a schematic diagram of a drive switching device which can be used in one embodiment of the present invention.

A structure corresponding to the case where the oscillator (520) is connected to the drain terminal and source terminal of the PMOS transistor (502), the oscillator (520) is connected in parallel to the PMOS transistor (502), the oscillator (521) is connected to the drain terminal and source terminal of the NMOS transistor (503), and the oscillator (521) is connected in parallel to the NMOS transistor (503) in the structure of FIG. 5C is shown in FIG. 5D. If attention is paid to an inverter circuit formed by the PMOS transistor (502) and NMOS transistor (503), then this is the same structure as in FIG. 5B. Since the structure of FIG. 5C includes one more inverter circuit, it is possible to the PMOS transistor and/or NMOS transistor of this inverter circuit in parallel to an oscillator respectively.

Figure 5E:
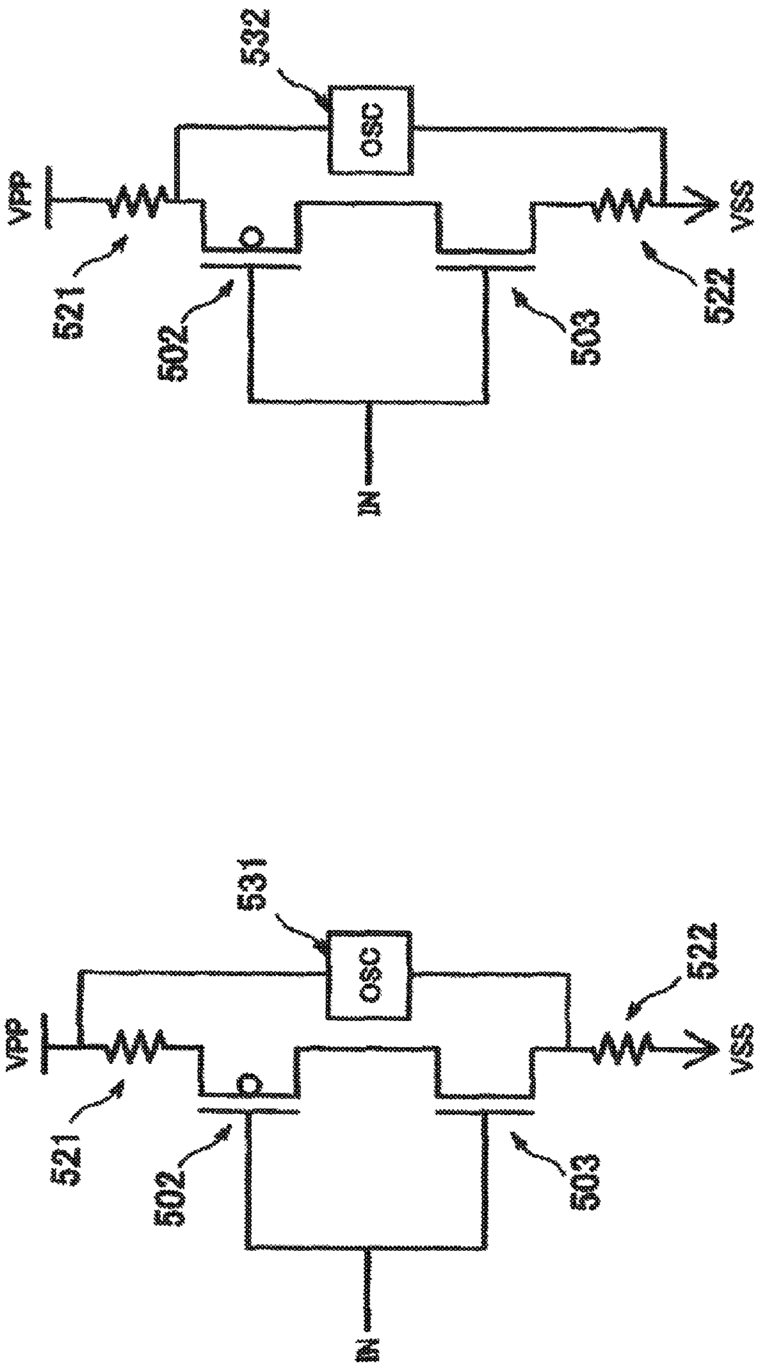
FIG. 5E is a schematic diagram of a drive switching device which can be used in one embodiment of the present invention.

Furthermore, although an oscillator is arranged in parallel with the PMOS transistor and/or NMOS transistor in FIG. 5B and FIG. 5D, the present invention is not limited to this structure. For example, as is shown in FIG. 5E(A), in the case where two resistors (521, 522) are connected in series with respect to the PMOS transistor (502) and NMOS transistor (503), the oscillator (531) may be arranged in parallel with the PMOS transistor (502), NMOS transistor (503) and resistor (521). In addition, as is shown in FIG. 5E(B), the oscillator (532) may be arranged in parallel with the PMOS transistor (502), NMOS transistor (503) and resistor (522).

Figure 5F:
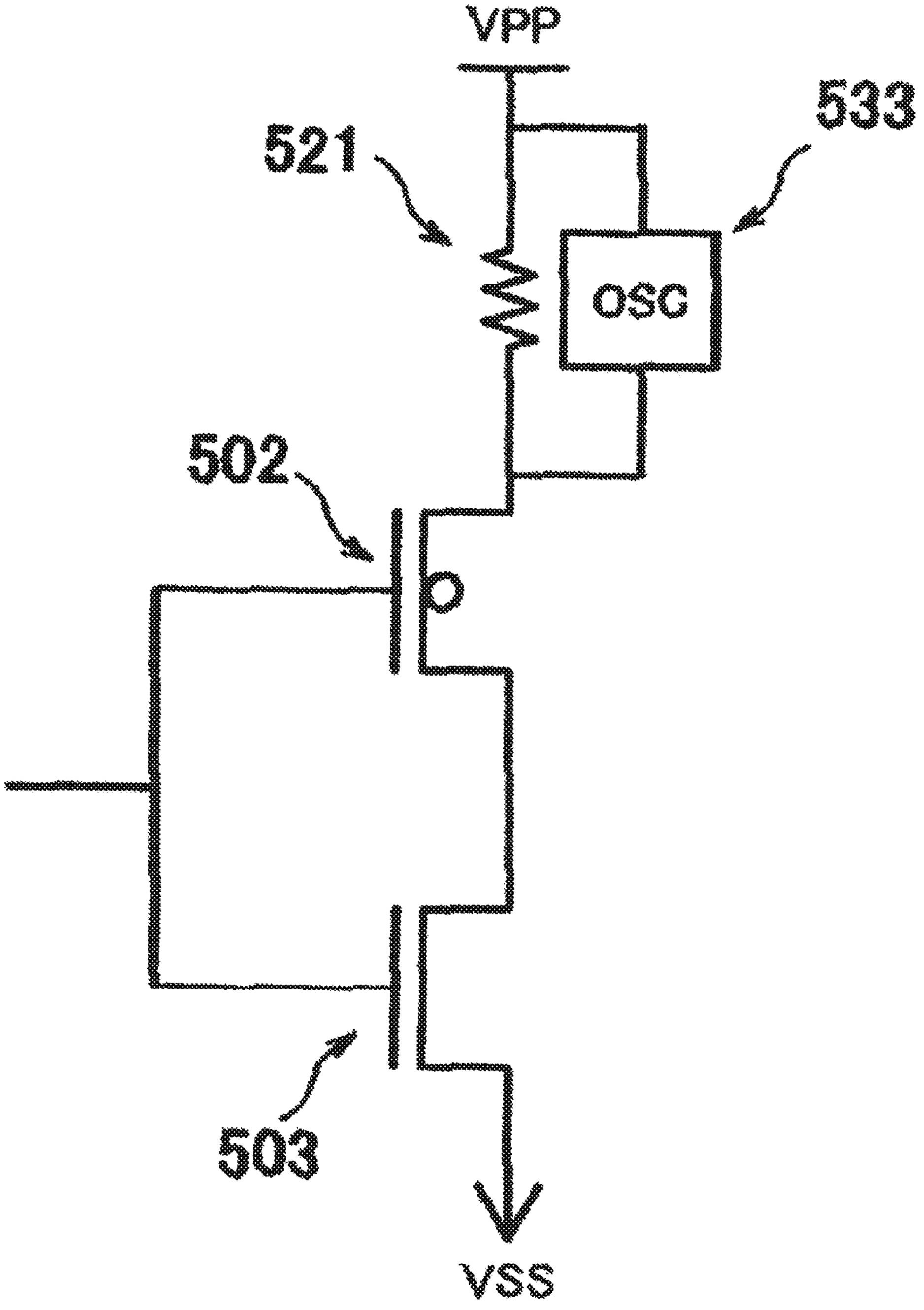
FIG. 5F is a schematic diagram of a drive switching device which can be used in one embodiment of the present invention.

In addition, as is shown in FIG. 5F for example, in the case where a resistor (521) exists connected in series with a PMOS transistor and/or NMOS transistor, it is possible to connect the oscillator (533) in parallel with that resistor (521).

Figure 6:
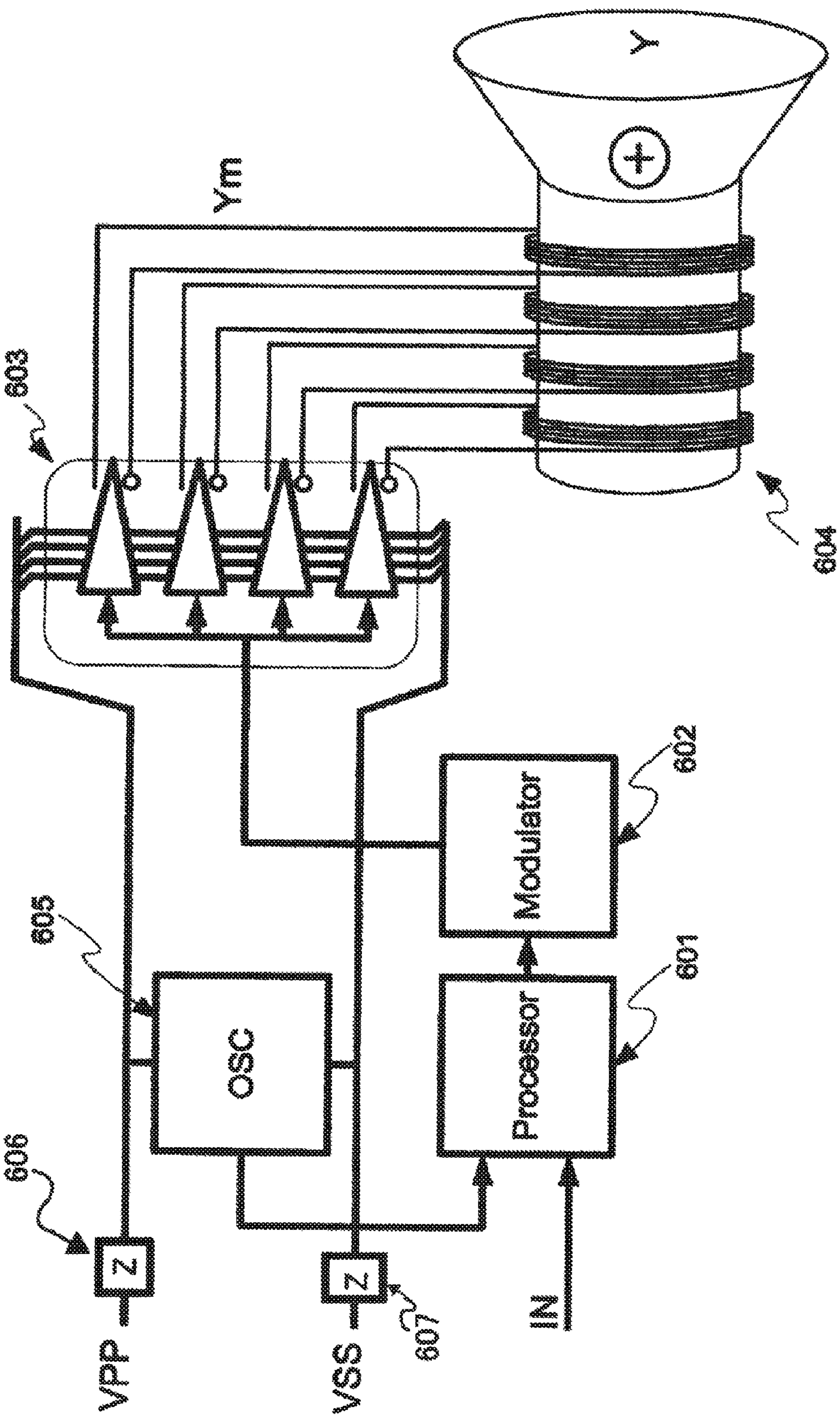
FIG. 6 is a schematic diagram of a speaker control device related to a third embodiment of the present invention.

A structure related to a fourth embodiment of the present invention is shown in FIG. 6. The speaker control device having the structure shown in FIG. 6 includes a digital signal IN, a digital signal processing device (601), a modulator (602), a plurality of drive switching devices (603), and a multi-coil speaker (604). The modulator (602) converts a digital signal from the digital signal processing device to a plurality of, for example, 3 values (+1, 0, −1) digital signals. The plurality of drive switching devices (603) is connected between VPP/VSS which are drive power supply terminals and amplify the plurality of 3 value (+1, 0, −1) digital signals. The multi-coil speaker (604) is a speaker including a plurality of coils. In addition, the symbols 606 and 607 show the presence of wire resistance within an LSI of VPP/VSS which are the drive power supply terminals, or parasitic resistance calculated from wires used in the connection between a package and LSI.

Each of the plurality of drive switching devices (603) may be connected between VPP/VSS respectively. In addition, there is a one to one corresponding relationship between the plurality of drive switching devices (603) and a plurality of coils, and in this case, it is possible for the plurality of drive switching devices (603) to supply a digital signal to a corresponding coil among the plurality of coils. The plurality of drive switching devices (603) supply an amplified digital signal to the speaker (604) and are sometimes referred to as a drive circuit which drives the speaker (604). In addition, a function is included for feeding back a clock output from the oscillator connected in the same way as in the first embodiment between VPP/VSS which are drive power supply terminals, to the digital signal processing device (601). That is, it is possible to connect the oscillator (605) in parallel to the plurality of drive switching devices (603) between VPP/VSS which are drive power supply terminals.

Furthermore, in FIG. 6, an oscillator is connected in parallel to the plurality of drive switching devices (603) between VPP/VSS which are drive power supply terminals. On the other hand, in one or two or more drive switching devices (603), as is shown in FIG. 5B, FIG. 5D, FIG. 5E or FIG. 5F, it is possible to connect an oscillator in parallel to one element or two or more elements connected in series among a plurality of elements.

In particular, in the case where each of the number of windings of a plurality of coils of the speaker (604) is substantially the same and characteristics such as the resistance values are substantially the same, in the case where a drive switching device (603) having a small number of selections is prioritized and selected according to the selection history of the plurality of drive switching devices (603) for example, it is considered that the amount of heat generated by each of the plurality of coils is about the same. Therefore, in this case, one device among a plurality of drive switching devices may be selected and the selected drive switching device may be connected to an oscillator.

Figure 7:
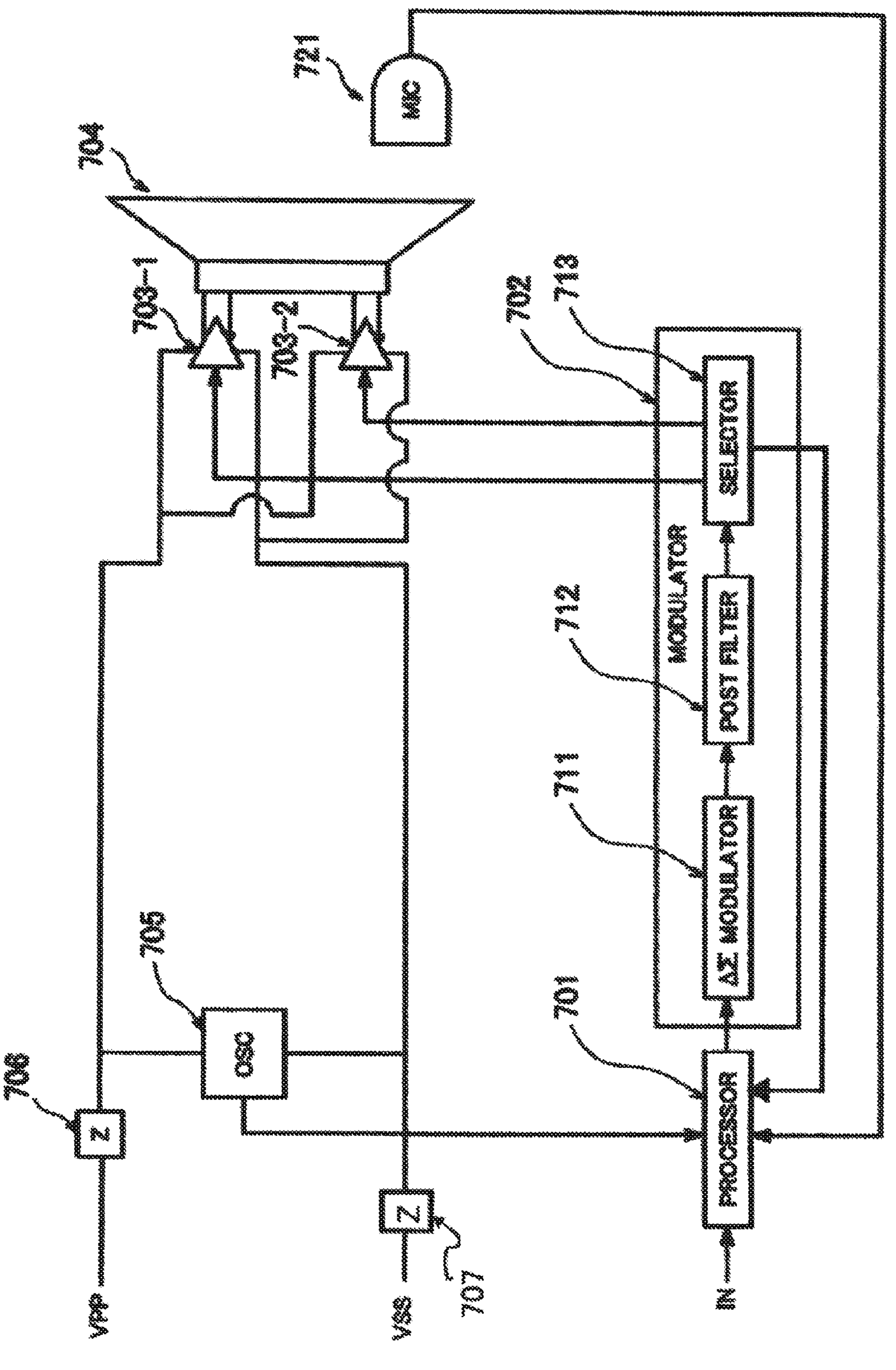
FIG. 7 is a schematic diagram of a speaker control device related to a fourth embodiment of the present invention.

A structure related to a fourth embodiment of the present invention is shown in FIG. 7. The same as the speaker control device shown in FIG. 6, a digital signal IN, a digital signal processing device (701), a modulator (702), a plurality of drive switching devices (703-1, 703-2), and a multi-coil speaker (704) are included. The modulator (702) converts a digital signal from the digital signal processing device (701) to a plurality of, for example, 3 values (+1, 0, −1) digital signals. The plurality of drive switching devices (703-1, 703-2) is connected between VPP/VSS which are drive power supply terminals and amplify the plurality of 3 value (+1, 0, −1) digital signals. The multi-coil speaker (704) is a speaker including a plurality of coils. Furthermore, although two drive switching devices are shown as the plurality of drive switching devices (703-1, 703-2) in FIG. 7, the number of drive switching devices may be three or more. In addition, the symbols 706 and 707 show the presence of wire resistance within an LSI of VPP/VSS which are the drive power supply terminals, or parasitic resistance calculated from wires used in the connection between a package and LSI.

In the present embodiment, the modulator (702) includes a ΔΣ modulator (711), a post filter (712) and a selector (713). The ΔΣ modulator (711) performs oversampling of a digital audio signal output by the digital signal processing device (701) and performs digital modulation. The post filter (712) converts the output of the ΔΣ modulator (711) to a thermometer code for example. The selector (713) performs selection of a plurality of drive switching devices (703-1, 703-2) according to the output of the post filter (713). The selected drive switching device flows a current to a corresponding coil.

The selector (713) calculates the frequency of selection of each drive switching device. From this calculation, it is possible for the selector (713) to select drive switching devise in order from the number of least selections. In this way, it is possible to suppress the occurrence of distortions in an output of a speaker (704) due to bias in the selection of a drive switching device.

In the present embodiment, a speaker control device includes a microphone (721) which obtains audio to be replayed by the speaker (704). The microphone (721) feeds back a signal expressing the magnitude of the obtained audio to the digital signal processing device (701). In addition, the selector (713) feeds back data related to the selection of a drive switching device to the digital signal processing device (701). In this way, the digital signal processing device (701) can obtain data related to the volume of audio replayed from the speaker (704) according to the selection of a drive switching device, and as a result, it is possible to calculate the characteristics of each drive switching device and a coil corresponding to each drive switching device.

The digital signal processing device (701) can feed back the calculated characteristics to the selector (713). As described above, the selector (713) refers to the characteristics of each drive switching device and a coil corresponding to each drive switching device when selecting a drive switching device in order from the least number of selections, and thereby it is possible to perform correction so that audio of the same volume is replayed even when the combination of selections with respect to the plurality of drive switching devices (703-1, 703-2) is different with respect to a digital signal IN which expresses the same volume, and increase the accuracy of audio replay.

Figure 8:
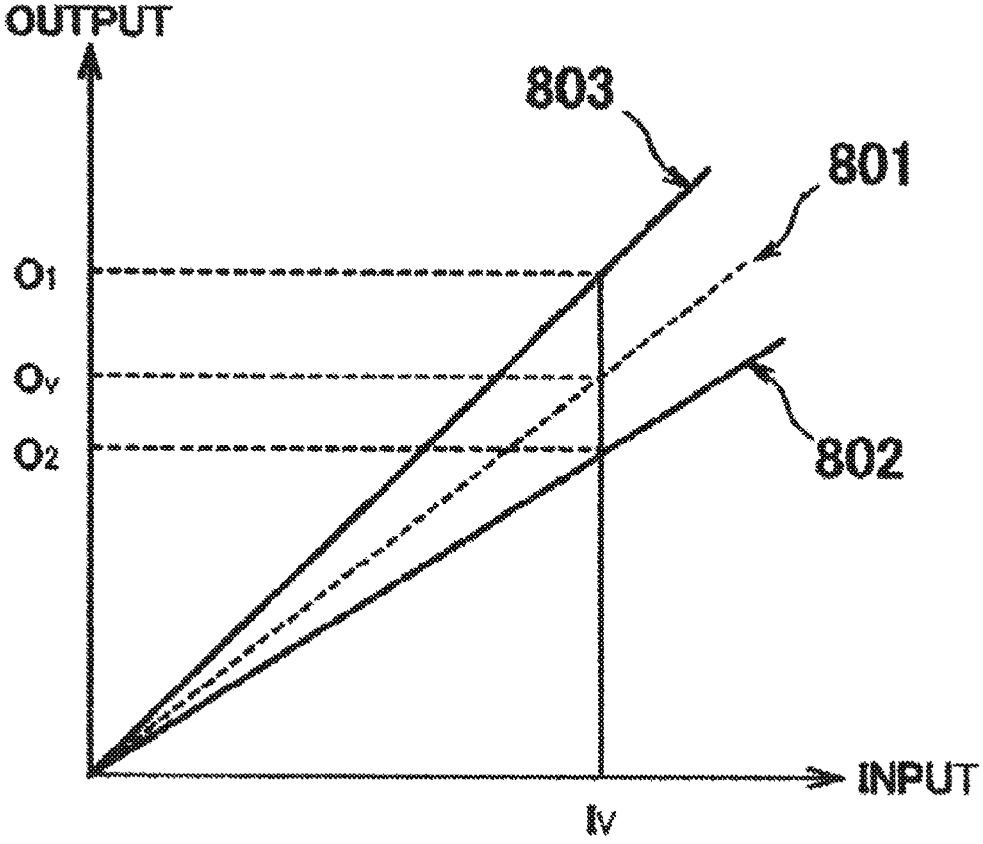
FIG. 8 is a diagram showing a correction of an output of a speaker control device related to one embodiment of the present invention.

FIG. 8 is a diagram for explaining correction of audio replay of the speaker (704) with respect to volume expressed by a digital signal IN. For example, in the case where volume expressed by a digital signal IN is Iv, ideally Ov is output from the characteristics of the dotted line (801). However, the volume of audio obtained by the microphone (721) and which has been fed back with respect to a selection of any one of the plurality of drive switching devices (703-1, 703-2), is assumed to be $O_2$ which is smaller than Ov. At this time, the digital signal processing device (701) feeds back to the selector (713) that $O_2$ has been output from the speaker (704) when Ov should be output. In this way, the selector (713) can detect that the characteristics of the drive switching device and a corresponding coil are not shown by the dotted line (801) but by the symbol 802. Therefore, in the speaker control device related to the present embodiment, it is possible to calculate the characteristics (803) which offset the characteristics shown by the symbol 802, output $O_1$ from the output $O_2$, and output with the characteristics of the dotted line (801).

In addition, when the speaker (704) is driven using the characteristics (803), by flowing a large current rather than driving using the characteristics (801) or characteristics (802), the temperature of a coil of the speaker (704) easily increases. Therefore, it is possible to perform control so that this correction is not performed according to the impedance of a coil of the speaker (704) calculated based on the oscillation of the oscillator (705).

It is possible to summarize the plurality of embodiments explained above as follows. In one embodiment of the present invention described above, by being connected between power supply terminals of a speaker drive circuit and digitally counting the frequency of an oscillator which electrically oscillates, a change in a current flowing in a coil of a speaker is detected. Since a voltage between power supply terminals within a speaker drive circuit decreases in proportion to a current flowing in a coil to be driven, it is possible to measure a current flowing in a coil using the frequency of an output signal of an oscillator which oscillates a frequency in proportion to a power supply voltage. More specifically, by latching and digitally counting a frequency of an output signal of an oscillator which oscillates a frequency in proportion to a power supply voltage using a clock signal (calculating an output value of a counter circuit input with an output signal), it is possible to measure a digital value in proportion to a current flowing in a coil. By controlling a current flowing to a coil of a speaker using this value in an input of feedback control, it is possible to provide a speaker control circuit which can prevent mechanical damage to a speaker.

Specifically, a ring oscillator comprised from an odd stage inverter connected in multi-stages is connected between power supply terminals for driving a speaker. Since a ring oscillator is basically a digital circuit, it can operate even using a low voltage. In addition, since an oscillation frequency has a relationship with a power supply voltage, it is possible to easily know a change amount of a power supply voltage by measuring the oscillation frequency.

In addition, it is possible to easily know a distortion component included in an output signal by comparing a frequency spectrum of an input digital signal with a frequency spectrum of a change amount of an oscillation frequency of an oscillator using a dynamic FFT analysis.

Furthermore, the following journal can be referenced with regards to mounting of a temperature sensor using a ring oscillator. IEEE JOURNAL OF SOLID-STATE CIRCUITS, VOL. 40, NO. 8, August 2005. The formulas 1~3 in the journal express a delay tie per stage of a ring oscillator. As can be seen from the formulas, the delay time of a ring oscillator ($\propto$1/oscillation frequency) has a relationship with a power source voltage.

As described above, according to the present invention, it is possible to detect a change in mechanical vibration compliance of a speaker by measuring a current flowing in the coil of a speaker without using a highly accurate analog-digital conversion device, and perform feedback control of a current flowing in a coil just using a digital circuit. In this way, low voltage, parallel arrangement and full bridge of a speaker drive device become easy.

Similarly, a digital value proportional to a current flowing in the coil is input to a heat resistor of a coil set with parameters by modeling. In addition, it is possible to estimate a rise in coil temperature by integrating a digital value in proportion to a current flowing in a coil.

Furthermore, it is possible to estimate a coil temperature by inputting a periphery temperature of a speaker to a heat resistor of a coil that is set with parameters by modeling.

In the case of estimating the temperature of a coil, it is necessary to integrate the current of all frequency regions which can be input to a speaker. In the case where the temperature of a coil exceeds a threshold value, it is possible to prevent mechanical damage to a speaker by reducing the amount of current flowing in a coil of a speaker by performing control to increase or decrease the gain of a digital signal within the digital signal processing device.

A digital value proportional to a current flowing in the coil is input to a linearity model of an output signal set with parameters by modeling. In addition, it is possible to correct the linearity of an output signal using the digital value in proportion to a current flowing in a coil.

In this case, it is possible to prevent non-linearity (worsening of distortions) of an output signal due to a drop in voltage caused by parasitic resistance of power supply wires by controlling the gain of a digital signal within the digital signal processing device according to the amount of current flowing in a coil.

It is possible to suppress mechanical output amplitude of a speaker by a digital value in proportion to a current flowing in a coil by inputting the digital value in proportion to the current flowing in the coil to a linearity model of a mechanical output amplitude of a speaker set with parameters by modeling.

In this case, it is possible to prevent non-linearity (worsening of distortions) of a mechanical output signal of a speaker by controlling the gain of a digital signal within the digital signal processing device according to the amount of current flowing in a coil.

When measuring the oscillation frequency of an oscillator, it is possible to increase the accuracy of an estimate of the current flowing in a coil by removing the common noise component included in an oscillation frequency using a primary noise shaping circuit, and correcting the non-linearity with a power supply voltage of the oscillation frequency of an oscillator. More specifically, it is possible to realize a primary noise shaping circuit by continuously operating without resetting a count circuit which measures the oscillation frequency of an oscillator and by subtracting a previous operating count output from the present count output.

In summary, in order to change vibration compliance according to usage in a small speaker such as that used in a mobile device, it is necessary to dynamically detect the impedance of a speaker, perform feedback control of a current flowing in a coil and prevent mechanical damage to a speaker. It is also necessary to measure a current in addition to a voltage for driving a speaker in order to measure impedance. However, when a serial resistor is input between a drive amplifier and a speaker in order to measure a current, a problem arises whereby there is a loss in output power of the speaker. In addition, it is necessary to mount a highly accurate analog-digital conversion circuit in order to measure a current. However, in order to mount a highly accurate analog-digital conversion circuit using a CMOS circuit, a problem arises whereby the unit cost of a LSI which is a control device does not decrease due to requiring a comparatively large silicon area. In addition, since it is difficult to provide a highly accurate low voltage analog-digital conversion circuit, there was a problem whereby it is difficult to realize a protection circuit suitable for a low voltage drive speaker drive device using a plurality of coils. These problems can be solved by using the present invention.

What is claimed is:

1. A speaker control device comprising:

an oscillator connected in parallel with a drive circuit between power supply terminals, the drive circuit driving a speaker, the oscillator changing an oscillation frequency according to a voltage between the power supply terminals; and a control circuit detecting a variation in the oscillation frequency of the oscillator, and adjusting an amount of current supplied to the speaker by the drive circuit in the case where a variation in the voltage exceeds an allowable value.

2. The speaker control device according to claim 1, wherein the oscillator is a ring oscillator device.

3. The speaker control device according to claim 2, wherein the oscillator includes an inverter circuit including a PMOS transistor and a NMOS transistor.

4. The speaker control device according to claim 1, wherein the control circuit divides frequency of an input signal representing audio output from the speaker by using a band pass filter, detects a variation in an oscillation frequency of the oscillator when a resonance frequency or a frequency in that vicinity of the speaker is detected, and as a result adjusts an amount of current supplied to the speaker by the drive circuit in the case where a variation in the voltage is detected.

5. The speaker control device according to claim 1, wherein the control circuit performs FFT of an oscillation frequency of the oscillator and detects a change amount in a frequency band including a resonance frequency of a speaker on a frequency axis.

6. The speaker control device according to claim 1, wherein the drive circuit amplifies a digital signal and supplies the digital signal to the speaker.

7. The speaker control device according to claim 6, wherein the digital signal is a three value digital signal.

8. The speaker control device according to claim 7, wherein the digital signal is a digital signal representing either +1, 0 or -1.

9. The speaker control device according to claim 1, wherein the control circuit estimates data of a coil temperature of the speaker based on a variation value or an integrated value of an oscillation frequency of the oscillator.

10. The speaker control device according to claim 1, wherein the control circuit estimates generation of mechanical distortion of the speaker based on a variation value or an integrated value of an oscillation frequency of the oscillator.

11. A speaker control method comprising: detecting by a control circuit a variation in an oscillation frequency of an oscillator connected in parallel with a drive circuit between power supply terminals, the drive circuit driving a speaker, the oscillator changing an oscillation frequency according to a voltage between the power supply terminals; judging, by the control circuit a variation in voltage from a variation in the oscillation frequency of the oscillator; and adjusting, by the control circuit an amount of current supplied to the speaker when a variation in the voltage exceeds an allowable value.

12. A speaker control device comprising:

an oscillator connected in parallel and outputting an alternating signal to one element or two or more elements connected in series among a plurality of elements forming a drive circuit for driving a coil of a speaker according to a digital signal;

an impedance calculation circuit extracting a signal of a frequency component of the alternating signal output by the oscillator and calculating a value corresponding to the magnitude of an impedance of the coil; and a control circuit controlling the magnitude of a signal supplied to the coil of the speaker according to the value calculated by the impedance calculation circuit.

13. The speaker control device according to claim 12, wherein the impedance calculation circuit calculates a value corresponding to the magnitude of an impedance of the coil based on a value of a correlation calculated by a first signal of a frequency component of the alternating signal output by the oscillator, and a second signal corresponding to the frequency component of an audio signal represented by the digital signal.

14. The speaker control device according to claim 12, wherein the value of the correlation is calculated by multiplying a value of the magnitude of amplitude of the first signal by the magnitude of amplitude of the second signal.

15. The speaker control device according to claim 12, wherein the digital signal includes an audio signal including a frequency of the frequency component.

16. The speaker control device according to claim 15, wherein the audio signal including a frequency of the frequency component is input separately to the digital signal.

17. The speaker control device according to claim 16, wherein a generator is included for generating the audio signal including a frequency of the frequency component, and the generator changes a frequency of the audio signal including a frequency of the frequency component.

18. The speaker control device according to claim 17, wherein a resonance frequency of a coil of the speaker is calculated based on a frequency of the audio signal including a frequency of the frequency component generated by the generator and a value calculated by the impedance calculation circuit.

19. The speaker control device according to claim 12, wherein the frequency component includes a resonance frequency of a coil of the speaker.

20. The speaker control device according to claim 12, wherein the drive circuit is an inverter circuit, and the oscillator is connected in parallel with respect to a circuit including a switching element of the inverter circuit.

21. The speaker control device according to claim 20, wherein the inverter circuit is formed by connecting a PMOS transistor and a NMOS transistor in series, and the oscillator is connected in parallel with respect to the PMOS transistor and/or the NMOS transistor.

22. The speaker control device according to claim 12, wherein the control circuit calculates an estimation value of a temperature of a coil of the speaker based on a value calculated and recorded by the impedance calculation circuit in the case where the temperature of the coil of the speaker is room temperature and a value presently calculated by the impedance calculation circuit.

23. The speaker control device according to claim 12, wherein a selector for performing selection of a drive circuit driving a coil of the speaker based on a digital signal, and a microphone for obtaining data related to the volume of audio played by the speaker are further arranged, the control device calculating characteristics of a coil of the speaker based on a selection by the selector and the data obtained by the microphone.

24. The speaker control device according to claim 1, wherein the control circuit adjusts an amount of current supplied to the speaker by the drive circuit according to the oscillation frequency.

25. A speaker control device comprising:

a control circuit adjusting an amount of current supplied to a speaker by a drive circuit in the case where a variation in an oscillation frequency of an oscillator is detected, wherein the oscillator is connected in parallel with a drive circuit between power supply terminals, the drive circuit drives the speaker, and the oscillator changes the oscillation frequency according to a voltage between the power supply terminals.

26. The speaker control device according to claim 25, wherein the control circuit adjusts an amount of current supplied to the speaker by the drive circuit according to a frequency.

27. The speaker control device according to claim 25, wherein the oscillator is a ring oscillator device.

28. The speaker control device according to claim 27, wherein the ring oscillator device includes an inverter circuit formed by a PMOS transistor and a NMOS transistor.

29. The speaker control device according to claim 25, wherein frequency division is performed by a band pass filter of an input signal representing audio output from the speaker, the control circuit detects a variation in an oscillation frequency of the oscillator when a resonance frequency or a frequency in that vicinity of the speaker is detected, and as a result adjusts an amount of current supplied to the speaker by the drive circuit in the case where a variation in the voltage is detected.

30. The speaker control device according to claim 25, wherein the control circuit performs FFT of an oscillation frequency of the oscillator and detects a change amount in a frequency band including a resonance frequency of a speaker on a frequency axis.

31. The speaker control device according to claim 25, wherein the drive circuit amplifies a digital signal and supplies the digital signal to the speaker.

32. The speaker control device according to claim 31, wherein the digital signal is a three value digital signal.

33. The speaker control device according to claim 32, wherein the digital signal is a digital signal representing either +1, 0 or -1.

34. The speaker control device according to claim 25, wherein the control circuit estimates data of a coil temperature of the speaker based on a variation value or an integrated value of a resonance frequency of the oscillator.

35. The speaker control device according to claim 25, wherein the control circuit estimates generation of mechanical distortion of the speaker based on a variation value or an integrated value of a resonance frequency of the oscillator.

* * * * *